(12) United States Patent
Cho et al.

(10) Patent No.: US 7,506,437 B2
(45) Date of Patent: Mar. 24, 2009

(54) PRINTED CIRCUIT BOARD HAVING CHIP PACKAGE MOUNTED THEREON AND METHOD OF FABRICATING SAME

(75) Inventors: Suk Hyeon Cho, Daejeon (KR); Chang Sup Ryu, Daejeon (KR); Jin Soo Jeong, Seoul (KR); Jin Yong Ahn, Daejeon (KR)

(73) Assignee: Samsung Electro-Mechanics Co., Ltd., Kyunggi-do (KR)

( * ) Notice: Subject to any disclaimer, the term of this patent is extended or adjusted under 35 U.S.C. 154(b) by 362 days.

(21) Appl. No.: 11/128,852

(22) Filed: May 13, 2005

(65) Prior Publication Data
US 2006/0060960 A1    Mar. 23, 2006

(30) Foreign Application Priority Data
Sep. 18, 2004    (KR) .................. 10-2004-0074872

(51) Int. Cl.
*H05K 3/02* (2006.01)
*H05K 3/10* (2006.01)
(52) U.S. Cl. ......................................... 29/846; 29/832

(58) Field of Classification Search ........... 29/846–853, 29/832–841
See application file for complete search history.

(56) References Cited

U.S. PATENT DOCUMENTS 6,603,915 B2 *  8/2003   Glebov et al. ............... 385/129
6,611,635 B1 *  8/2003   Yoshimura et al. ............ 385/14

FOREIGN PATENT DOCUMENTS

JP    2002-0062308 A    7/2002
KR    2001-106440 A    11/2001

OTHER PUBLICATIONS

Patent Abstracts of Japan for 11274734 A Published on Oct. 8, 1999.

* cited by examiner

*Primary Examiner*—Jeremy C Norris
(74) *Attorney, Agent, or Firm*—Darby & Darby P.C.

(57) ABSTRACT

Disclosed is a printed circuit board (PCB) and a method of fabricating the same. A contact portion is formed on an internal layer of the multi-layered PCB. A groove is formed so as to expose the contact portion of the internal layer. A chip package is mounted on the PCB while being flip-chip bonded to the exposed contact portion of the internal layer.

5 Claims, 27 Drawing Sheets

US 7,506,437 B2

PRINTED CIRCUIT BOARD HAVING CHIP PACKAGE MOUNTED THEREON AND METHOD OF FABRICATING SAME

INCORPORATION BY REFERENCE

The present application claims priority under 35 U.S.C. §119 to Korean Patent Application No. 2004-74872 filed on Sep. 18, 2004. The content of the application is incorporated herein by reference in its entirety.

BACKGROUND OF THE INVENTION

1. Field of the Invention

The present invention relates, in general, to a printed circuit board (PCB) and a method of fabricating the same and, more particularly, to a PCB and a method of fabricating the same, in which a contact portion is formed on an internal layer of the multi-layered PCB, a groove is formed so as to expose the contact portion of the internal layer, and a chip package is mounted on the PCB while being flip-chip bonded to the exposed contact portion of the internal layer.

2. Description of the Prior Art

A semiconductor package is exemplified by a resin seal package, a tape carrier package (TCP), a glass seal package, and a metal seal package. Furthermore, the semiconductor package is classified into a TH-type, in which a hole is formed through a PCB and a pin is inserted into the hole, and a surface mounting technology (SMT) type, in which it is mounted on a surface of a PCB, according to a mounting method thereof.

The TH-type is the typical integrated circuit (IC) package which has been used for the longest time, and representative examples include a dual inline package (DIP), in which a plurality of pins protrude from both sides of the package in a straight line, and a pin grid array (PGA), in which pins are arranged on the underside of a large hexahedron.

The SMT-type is a package having a structure in which, when a packaged chip is electrically connected to a substrate, the electric connection is achieved on the substrate unlike the TH-type, in which the pin is inserted into the hole and soldered.

Compared to the TH-type, the SMT-type is advantageous in that, assuming that chips having the same size are employed, the mounting area is reduced because of the small size, it is thin and lightweight, and operation speed improves with an increase in frequency because of a low parasitic capacitance or inductance.

Other advantages are that it is unnecessary to form a hole, a soldering region and a pitch can be reduced, it is possible to achieve highly dense wiring and mounting, and the cost of fabricating a PCB can be reduced. However, the SMT-type is disadvantageous in that it is difficult to inspect the appearance of a soldered part.

Representative examples of the SMT-type package include a quad flat package (QFP), a plastic leaded chip carrier (PLCC), a ceramic leaded chip carrier (CLCC), and a ball grid array (BGA).

Meanwhile, there are some limits with respect to the size and thickness of a PCB in the course of mounting many parts on the PCB. Recently, demand for slim mobile devices which are handy to carry is growing, and thus, it is necessary to arrange integrated and passive components in a space having a restricted area and height on a surface of the PCB.

A thin chip may be fabricated to satisfy such a necessity. In this case, however, handling problems and signal interference problems between layers may occur.

In other words, multiple layers of integrated circuit chips are integrated in one conventional integrated circuit chip package. At this time, the integrated circuit chip must be very thin in order to insert many layers of chips into a package having a restricted thickness. However, since the integrated circuit chip is very thin, it is difficult to handle the chip and signal interference problems between the integrated circuit chips occur.

Meanwhile, a technology of embedding an integrated circuit chip in a PCB has been suggested to compensate for insufficient space.

With respect to the above technology, Japanese Pat. Laid-Open Publication No. 11-274734 discloses an electronic circuit device which is provided with a circuit substrate that acts as a core, electronic parts mounted on the circuit substrate, an insulating layer formed on the circuit substrate, and a circuit formed on the insulating layer.

FIG. 1 is a sectional view of a conventional PCB having a chip mounted thereon.

Referring to FIG. 1, in the conventional PCB having the chip mounted thereon, a circuit substrate 10 is used as a core, and circuit patterns 12, 18 are formed on upper and lower sides of the circuit substrate.

A through hole 13 is formed through the circuit substrate 10 to connect external and internal circuits to each other. A chip 16 is flip-chip bonded to the circuit substrate 10 and thus mounted on it. A welding bump 17 formed on a pad of the integrated circuit chip 16 is connected to a land 18 on the circuit substrate 10.

Additionally, a plurality of insulating layers 22 is laminated on the circuit substrate 10, and a circuit pattern 25 is formed on each of the insulating layers 22.

At this stage, an integrated circuit chip 29 is mounted on an external surface of the outermost layer 22 of the insulating layers 22, and connected to a wire pattern on the surface of the outermost insulating layer 22.

However, in the conventional technology of embedding the integrated circuit chip in the PCB, it is difficult to form a passage for emitting heat, and thus, it is hard to apply the technology to an integrated circuit chip which generates a lot of heat.

Furthermore, since it is necessary to control occurrence of dust during the fabrication of the PCB to be the same level as that during the fabrication of a semiconductor, undesirably, clean room facilities must be newly installed or the level of dust must be tightly controlled.

SUMMARY OF THE INVENTION

Therefore, the present invention has been made keeping in mind the above disadvantages occurring in the prior arts, and an object of the present invention is to provide a PCB and a method of fabricating the same. In the method, a contact portion, on which a chip package is to be mounted, is formed in the PCB, the lamination of layers is conducted so that the contact portion formed on an internal layer of a substrate is exposed, and the chip package is flip-chip bonded to the contact portion of the internal layer, thereby mounting the thick chip package in a space having a restricted height on a surface of the substrate.

The above object can be accomplished by providing a PCB having a chip package mounted thereon, which comprises a substrate having a plurality of electric contact portions formed on an upper side thereof and acting as a core. The chip package is mounted on the substrate and has bumps connected to the electric contact portions. An insulating layer is laminated on the substrate and has a hole in which the chip package is to be mounted.

Furthermore, the present invention provides a method of fabricating a PCB having a chip package mounted thereon. The method includes the steps of forming a first etching resistor to form an electric contact portion on an upper side of a first circuit layer on one side of a substrate; applying a first photosensitive substance on the first circuit layer of the substrate to form a first circuit pattern on the first circuit layer, and removing the first photosensitive substance; laminating an insulating layer and a second circuit layer on the substrate, and forming a hole through a portion of the insulating layer, in which the chip package is to be mounted; applying a second photosensitive substance to form a second circuit pattern on the second circuit layer, and forming the electric contact portion on the exposed first circuit layer of the substrate, on which the first etching resistor is formed; and mounting the chip package so that the chip package is connected to the electric contact portion formed on an exposed internal layer of the substrate.

Furthermore, the present invention provides a method of fabricating a PCB having a chip package mounted thereon. The method includes the steps of laminating an insulating layer and a first circuit layer on an upper side of a second circuit layer on one side of a substrate, on which a first circuit pattern is formed; removing portions of the insulating layer and the first circuit layer laminated on the substrate, which have a position corresponding to an area in which the chip package is to be mounted; applying a photosensitive substance on internal and external layers so that the photosensitive substance adheres closely to the internal and external layers, and forming a second circuit pattern on the photosensitive substance to form an electric contact portion and to form a third circuit pattern on the external layer; conducting an etching process using the second circuit pattern, formed on the photosensitive substance, to form the third circuit pattern on the external layer and to form the electric contact portion on the internal layer; and mounting the chip package so that the chip package is connected to the electric contact portion formed on the exposed second circuit layer of the substrate.

Furthermore, the present invention provides a method of fabricating a PCB having a chip package mounted thereon. The method includes the steps of forming a first circuit pattern, which includes an electric contact portion, to be connected to the chip package, on a first circuit layer of a substrate; laminating an insulating layer and a second circuit layer on an upper side of the first circuit layer on one side of the substrate, on which the first circuit pattern is formed; removing portions of the insulating layer and the second circuit layer laminated on the substrate, which have a position corresponding to an area in which the chip package is to be mounted; and mounting the chip package so that the chip package is connected to the electric contact portion formed on the exposed first circuit layer of the substrate.

Furthermore, the present invention provides a method of fabricating a PCB having a chip package mounted thereon. The method includes the steps of forming a first circuit pattern, which includes an electric contact portion, to be connected to the chip package, on a first circuit layer of a substrate; surrounding the electric contact portion using an etching resistor; laminating an insulating layer, through which a hole is formed so as to mount the chip package therein while the chip package being connected to the electric contact portion, and laminating a second circuit layer on the insulating layer; laminating a photosensitive substance on the second circuit layer, forming a second circuit pattern, of which a portion, having a position corresponding to the hole, is removed, on the photosensitive substance, and etching the resulting substrate to form a third circuit pattern on the second circuit layer; and mounting the chip package so that the chip package is connected to the electric contact portion formed on the exposed first circuit layer of the substrate.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE INVENTION

Hereinafter, a detailed description will be given of the present invention with reference to FIGS. 2 to 9d.

Figure 1:
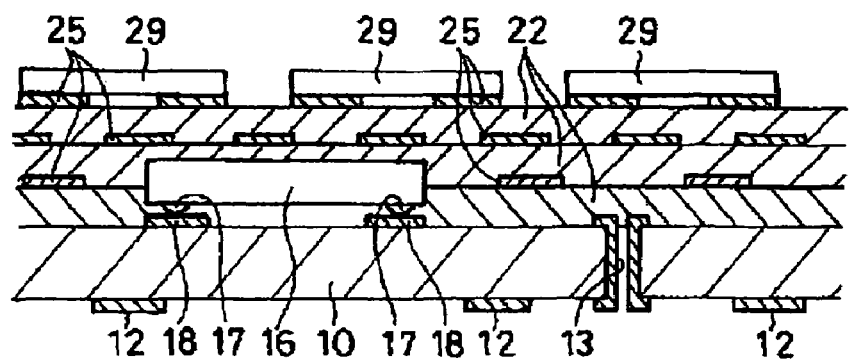
FIG. 1 is a sectional view of a conventional PCB having a chip mounted thereon.
Figure 2:
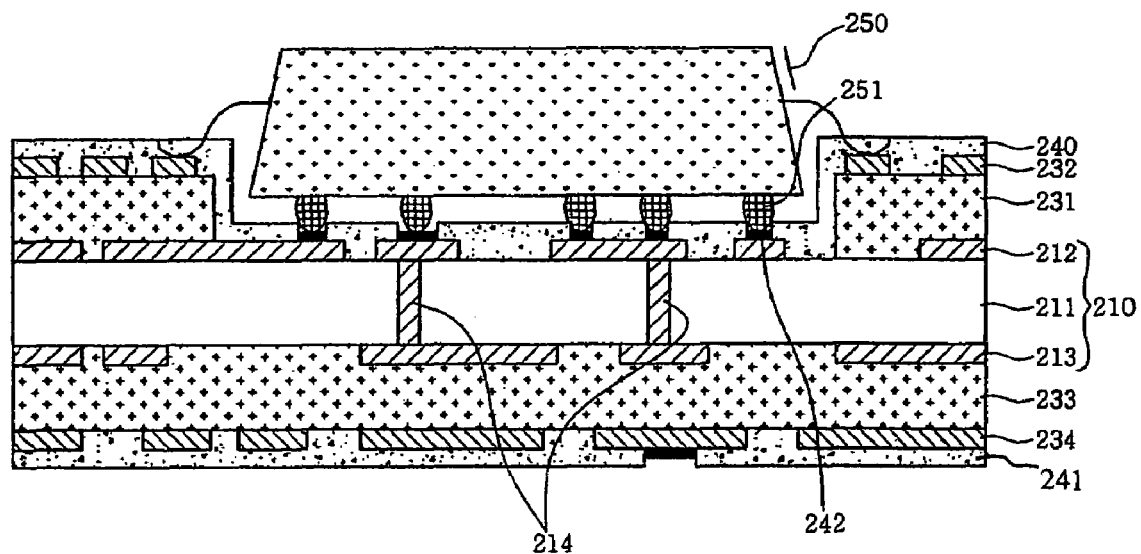
FIG. 2 is a sectional view of a PCB having a chip package mounted thereon according to an embodiment of the present invention.

FIG. 2 is a sectional view of a PCB having a chip package mounted thereon according to an embodiment of the present invention.

Referring to FIG. 2, the PCB having the chip package mounted thereon according to an embodiment of the present invention comprises a copper clad laminate 210 acting as a core, a plurality of insulating layers 231, 233 laminated on the copper clad laminate 210, a plurality of circuit layers 232, 234, solder resist films 240, 241 applied on the external circuit layers 232, 234 and an exposed internal circuit layer 212, a chip package 250, and a conductive material 242 interposed between bumps 251 of the chip package 250 and contact portions of the internal circuit layer 212.

The copper clad laminate 210 is made of an insulating material, and comprises an insulating layer 211 having a predetermined thickness, and copper foil layers 212, 213 positioned on both sides of the insulating layer 211 and having circuit patterns.

In this respect, the contact portions, to which the bumps 251 of the chip package 250 are capable of being flip-chip bonded, are formed on the copper foil layer 212 on one side of the insulating layer 211. The contact portions are electrically connected to other portions 213 through through holes 214.

Additionally, a groove, which corresponds in size to the chip package 250, is formed on the insulating layer 231 laminated on an upper side of the copper clad laminate 211 so that the chip package 250 is flip-chip bonded to the contact portions formed in the internal circuit layer 212. Furthermore, the contact portions of the internal circuit layer 212 are exposed.

The chip package 250 is flip-chip bonded through the groove to the contact portions using the bumps 251 attached thereto, thereby being mounted on the PCB.

At this stage, the electric conductive material 242 may be applied so as to improve the adhesion strength between the bumps 251 of the chip package 250 and the contact portions.

Furthermore, the solder resist may be applied on the external circuit layers 232 and the exposed internal circuit layer 212.

As well, as shown in FIG. 2, a side wall connection is feasible by use of a lead frame, and thus, it is possible to assure many channels for signal connection.

Figure 3A:
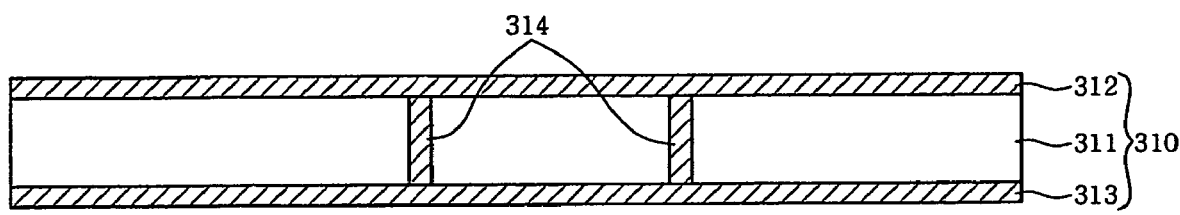
FIGS. 3a to 3p are sectional views illustrating the fabrication of the PCB having the chip package mounted thereon according to an embodiment of the present invention.
Figure 3B:
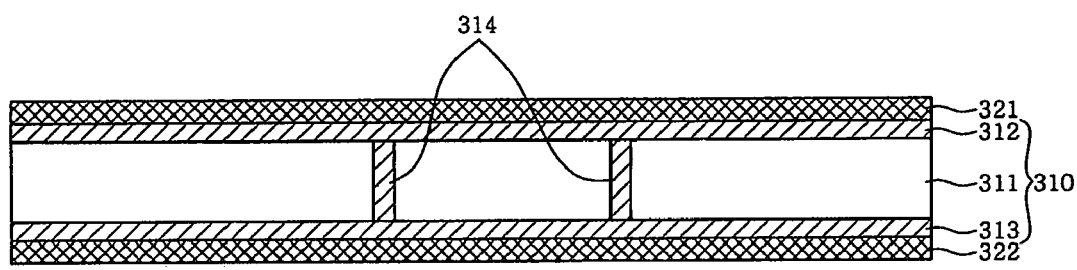
Figure 3C:
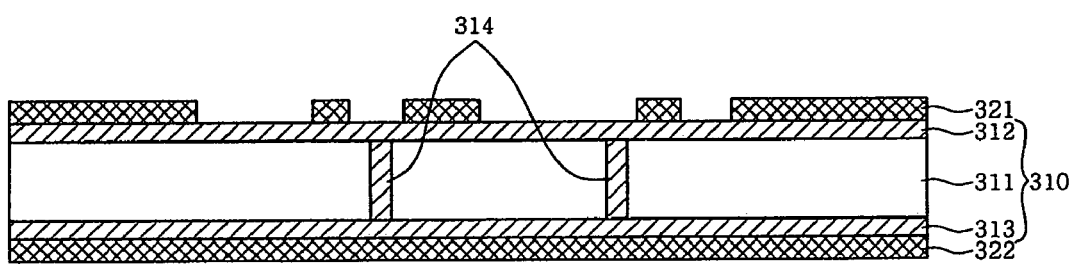
Figure 3D:
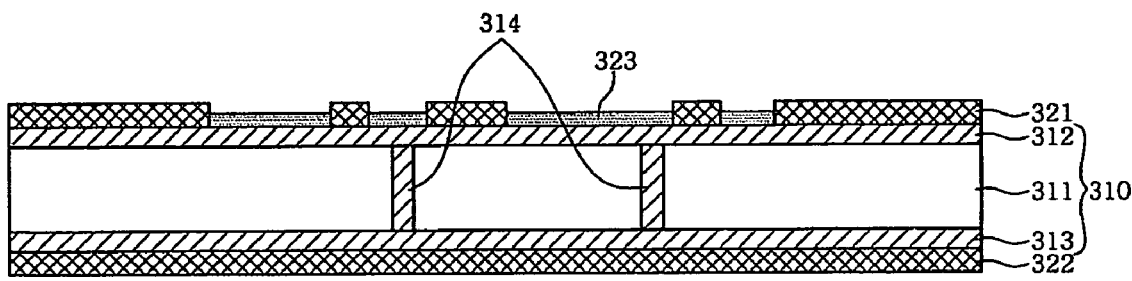
Figure 3E:
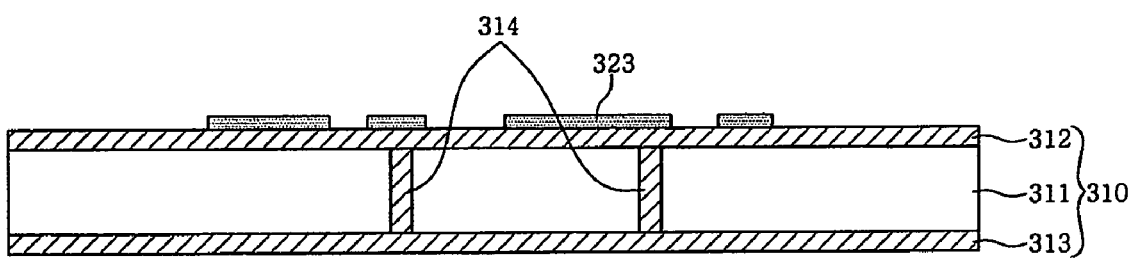
Figure 3F:
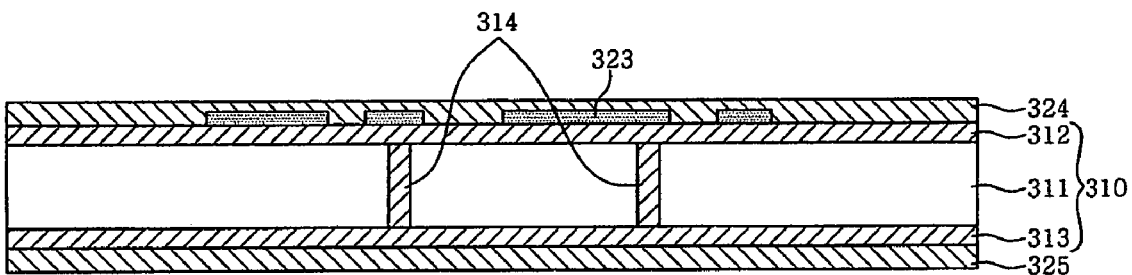
Figure 3G:
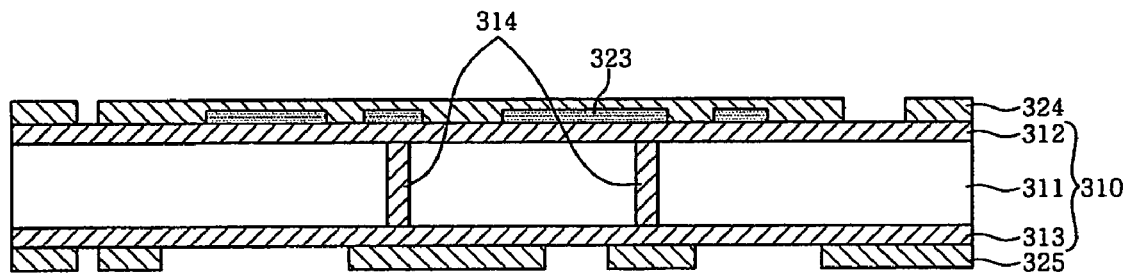
Figure 3H:
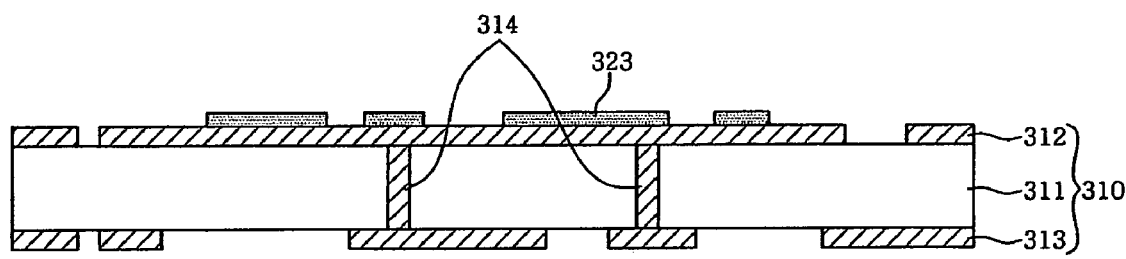
Figure 3I:
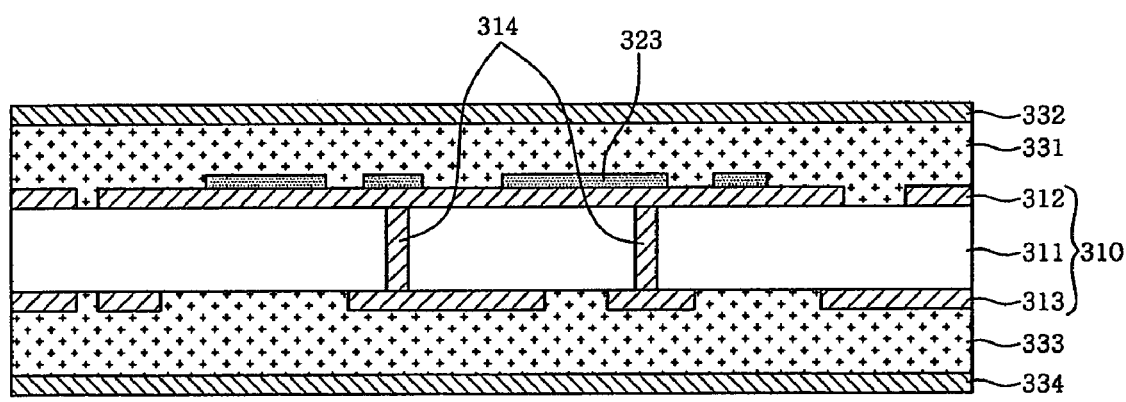
Figure 3J:
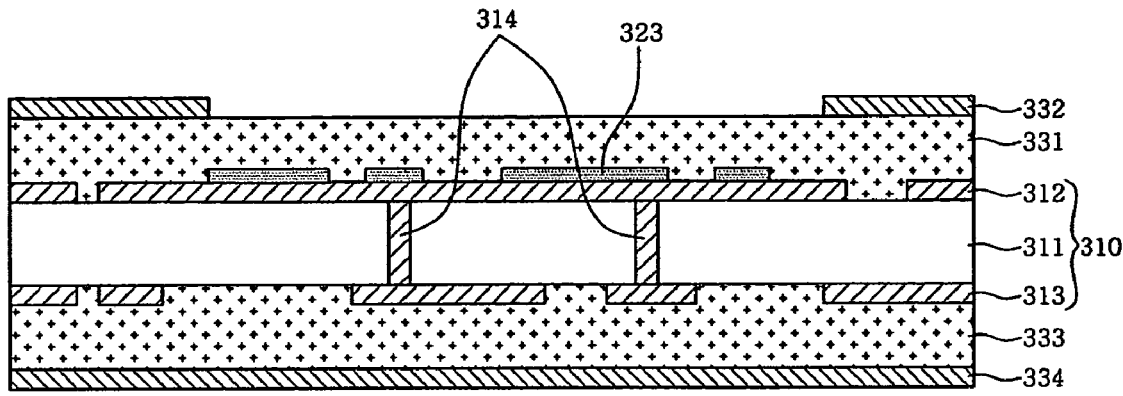
Figure 3K:
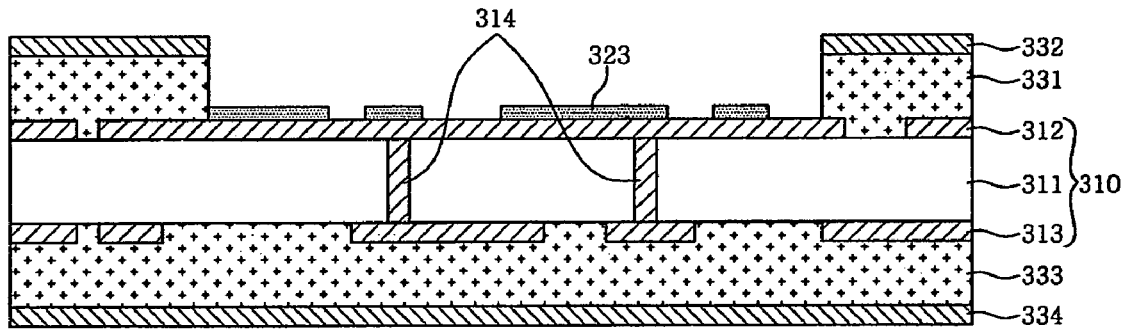
Figure 3L:
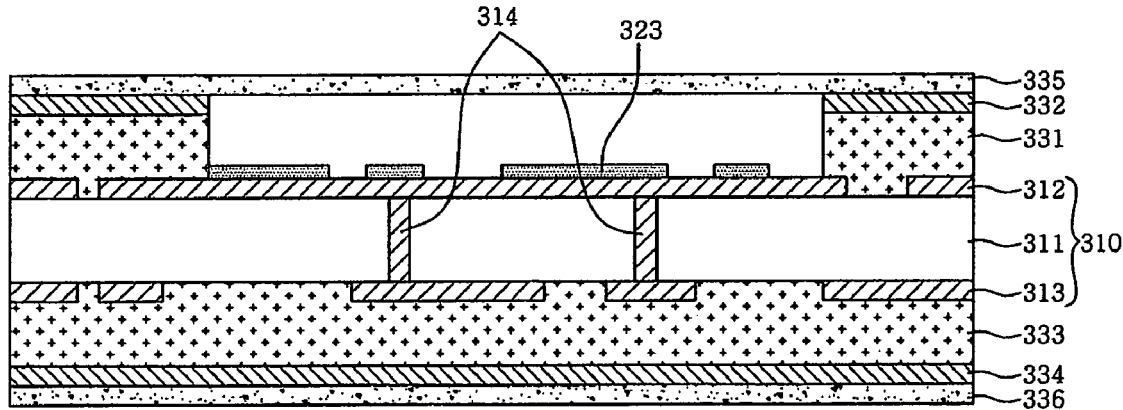
Figure 3M:
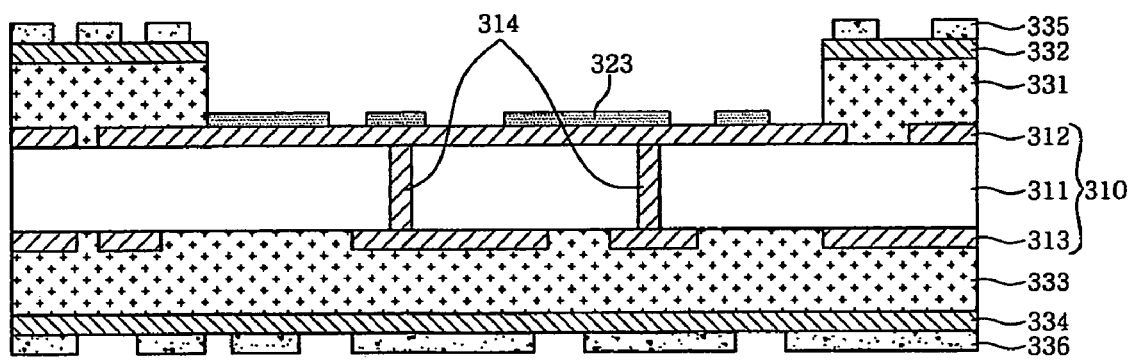
Figure 3N:
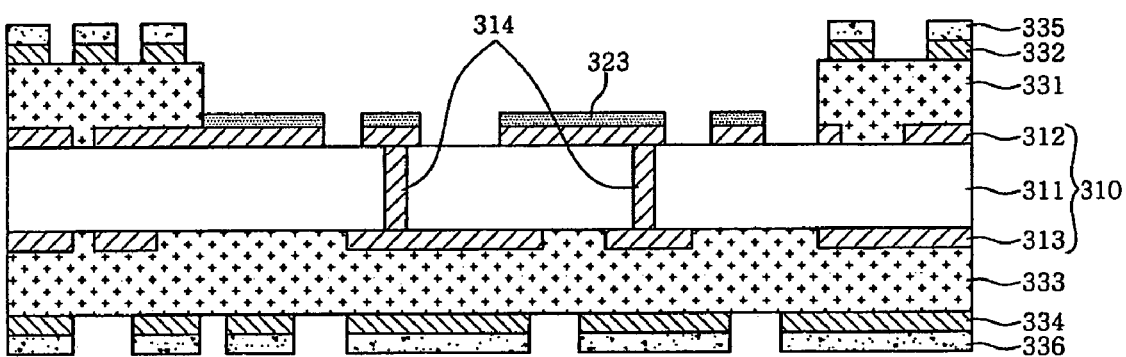
Figure 3O:
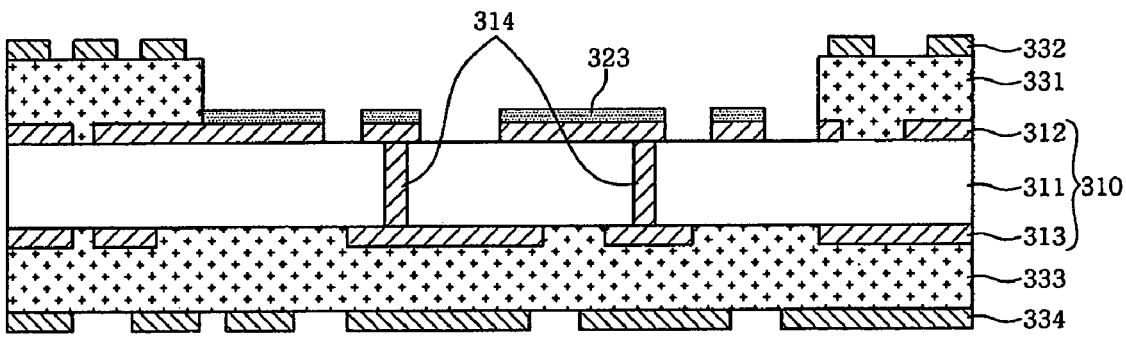
Figure 3P:
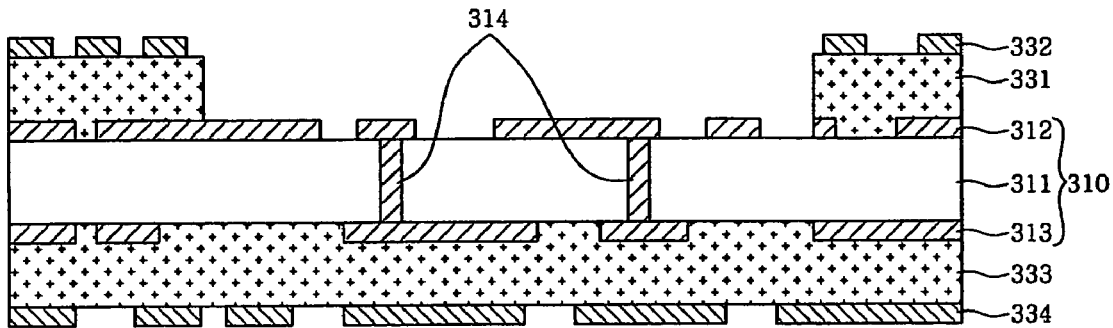

FIGS. 3a to 3p are sectional views illustrating the fabrication of a PCB having a chip package mounted thereon according to an embodiment of the present invention.

Referring to FIG. 3a, a circuit substrate 310 acting as a core is provided. The circuit substrate 310 is made of an insulating material, and comprises an insulating layer 311, having a predetermined thickness, and copper foil layers 312, 313 positioned on upper and lower sides of the insulating layer 311. Furthermore, a plurality of through holes 314 is formed through the circuit substrate 310 to connect circuits on both sides of the circuit substrate to each other.

With reference to FIGS. 3b and 3c, photosensitive substances 321, 322 are applied on the copper foil layers 312, 313 of the circuit substrate 310. Subsequently, the upper photosensitive substance 321 is selectively removed through exposure and development processes to expose a portion of the copper foil layer 312 which is not to be removed, thereby forming a portion on which the chip package is to be mounted. Such a photolithography process may be classified into a photographic process and a screen printing process. Employing an art work film having a circuit pattern printed thereon, the photographic process is divided into a dry film (D/F) process using a dry film as a photosensitive material, and a photosensitive liquid process using photosensitive liquid.

Referring to FIG. 3d, an etching resistor 323, which is capable of being used as a resistor during a copper etching process using gold or nickel, is applied on the exposed portion of the copper foil layer so as to prevent the copper foil layer from being etched when the copper etching process is conducted using gold or nickel, thereby providing an electric connection to the chip package to be mounted. At this time, it is preferable to form the etching resistor 323 through a plating process.

Referring to FIG. 3e, the photosensitive substances 321, 322 are removed from both sides of the copper foil layers 312, 313 using a stripping process, and photosensitive substances 324, 325 are further applied to form a circuit as shown in FIG. 3f.

At this time, a portion of the photosensitive substances 324, 325 corresponding in position to an area in which the chip package is to be mounted is not etched. However, the remaining portion, under which the copper foil layer is to be etched, is exposed and developed to expose a portion of the copper foil layer to be etched, as shown in FIG. 3g.

As shown in FIG. 3h, after a circuit pattern of the copper foil is formed using circuit patterns of the photosensitive substances 324, 325 as an etching resist, the photosensitive substances 324, 325 as the etching resist are stripped to complete the formation of the circuit pattern of the copper foil. At this time, the etching resistor 323 must not be removed.

Next, after an etching process is conducted as shown in FIG. 3i to form a circuit on an internal layer, the photosensitive substances 324, 325 are removed through a stripping process, and a plurality of insulating layers 331, 333 and circuit layers 332, 334 are further laminated.

As shown in FIG. 3j, in order to remove a portion of the insulating layer 331, corresponding in position to an area in which the chip package is to be mounted, the copper foil positioned on that portion of the insulating layer 331 is removed through a process using a laser or a plasma.

Subsequently, after a portion of the copper foil, corresponding in position to an area in which the chip package is to be mounted, is removed as shown in FIG. 3k, a portion of the insulating layer 331, also corresponding in position to the area in which the chip package is to be mounted, is removed through a process, using a laser or a plasma, capable of removing the insulating layer 331. At this time, if necessary, it is preferable to control the removal of the insulating layer so as to prevent the resulting substrate from being excessively removed. Additionally, it is preferable that a material of the insulating layer, which is to be removed, be different from that of the insulating layer, which must not be removed, so as to prevent the insulating layer, which must not be removed, from being etched.

As shown in FIG. 3l, photosensitive materials 335, 336 are applied to form circuits on the outermost layers 332, 334.

As shown in FIG. 3m, the photosensitive materials 335, 336 are exposed and developed to form circuit patterns thereon. At this time, a portion of the photosensitive materials 335, 336, corresponding in position to an area in which the chip package is to be mounted, is removed so that an exposed copper foil portion of the internal layer 312, corresponding in position to an area in which the chip package is to be mounted, is removed by a copper etching process.

As shown in FIG. 3n, wire patterns are formed on the external circuit layers 332, 334 and the exposed internal copper foil layer 312 using the circuit patterns of the photosensitive materials 335, 336 and the etching resistor 323 as an etching resist. In other words, circuits are formed on a surface of the resulting substrate and the copper foils 312, 332, 334 of the internal layer through the etching process.

As shown in FIG. 3o, after the photosensitive materials 335, 336 are completely removed through a stripping process, the chip package is mounted on the surface of the internal layer of the substrate. In the case where the etching resistor 323 formed on the internal layer must be removed, the removal may be conducted through an etching resistor stripping process as shown in FIG. 3p. However, if the etching resistor is formed by gold plating, it is preferable that the etching resistor be not removed.

Figure 4A:
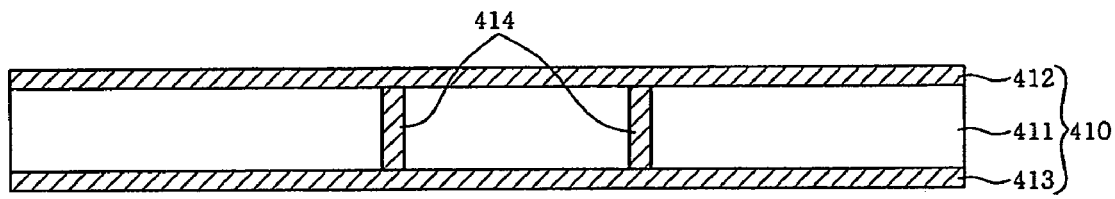
FIGS. 4a to 4q are sectional views illustrating the fabrication of a PCB having a chip package mounted thereon according to a further embodiment of the present invention.
Figure 4B:
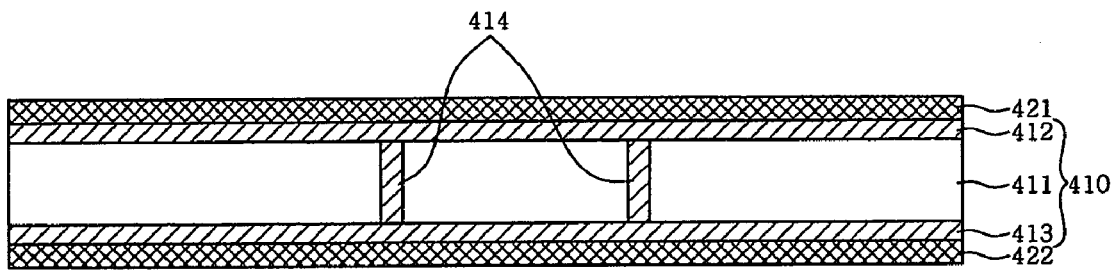
Figure 4C:
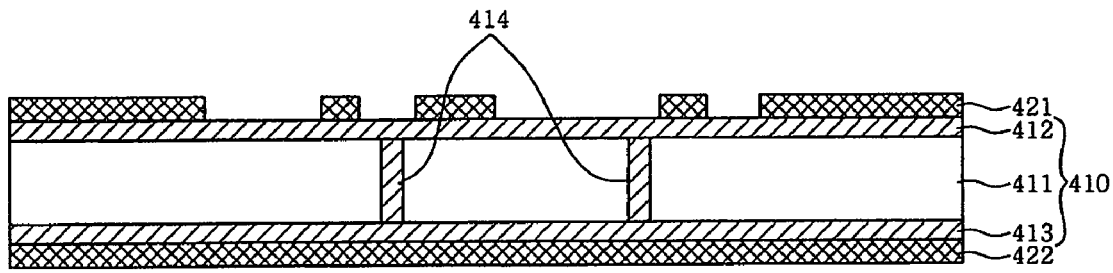
Figure 4D:
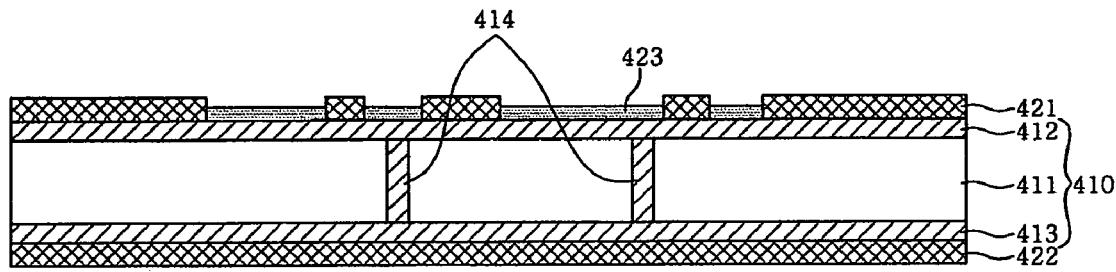
Figure 4E:
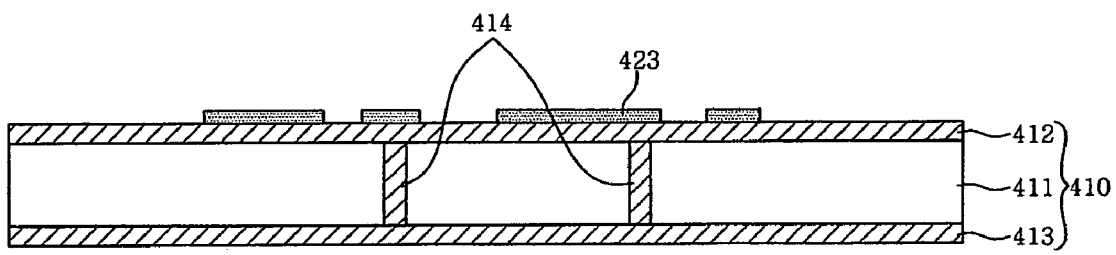
Figure 4F:
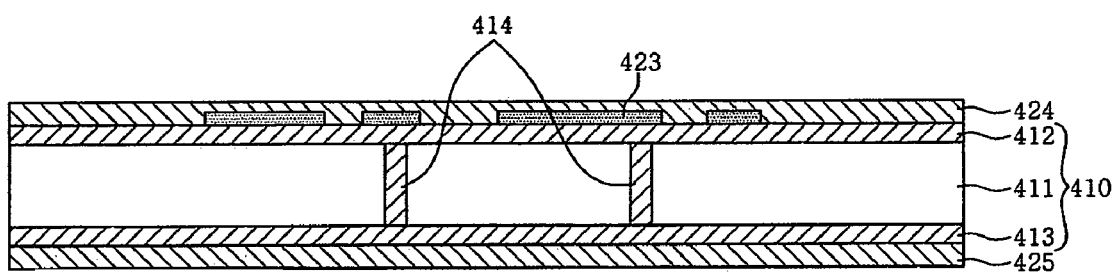
Figure 4G:
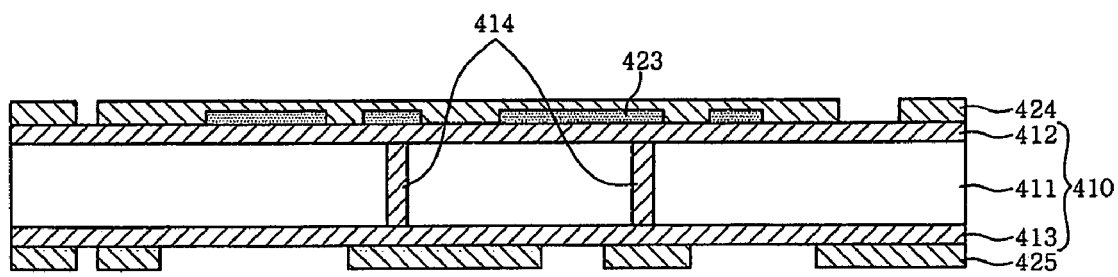
Figure 4H:
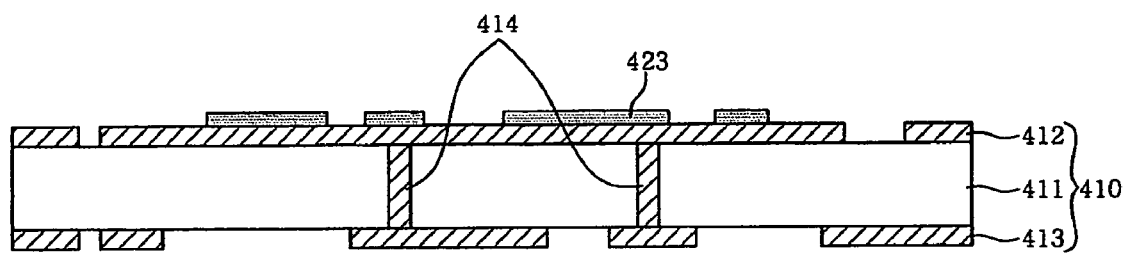
Figure 4I:
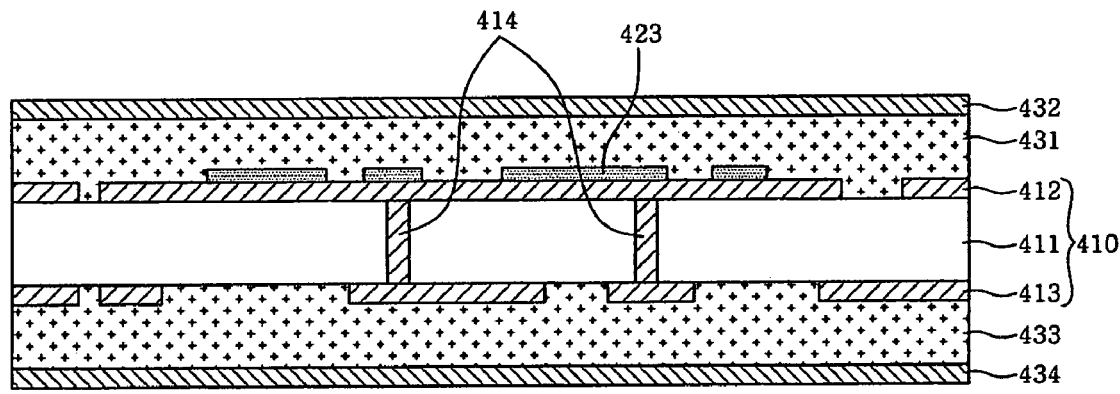
Figure 4J:
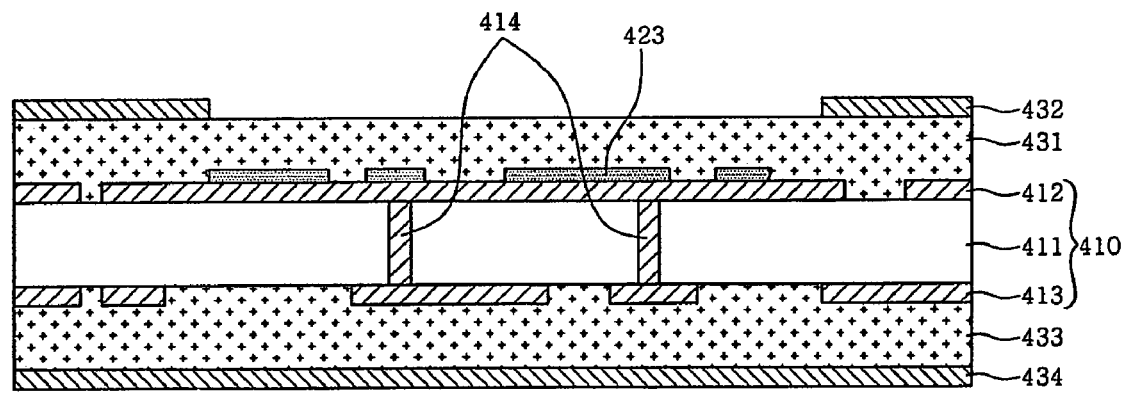
Figure 4K:
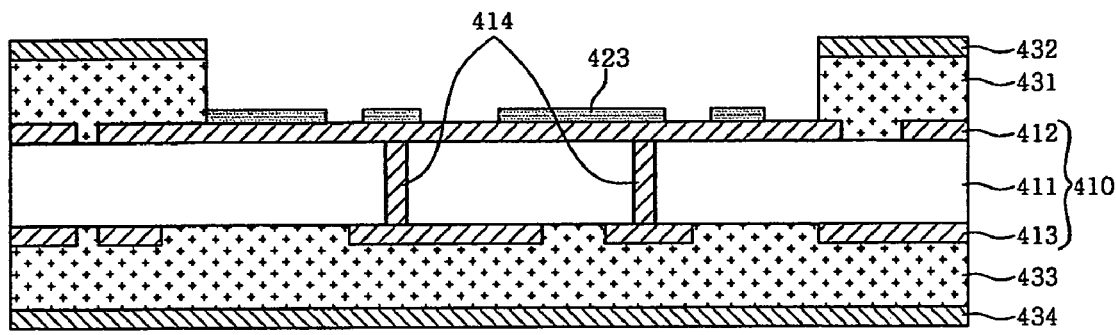
Figure 4L:
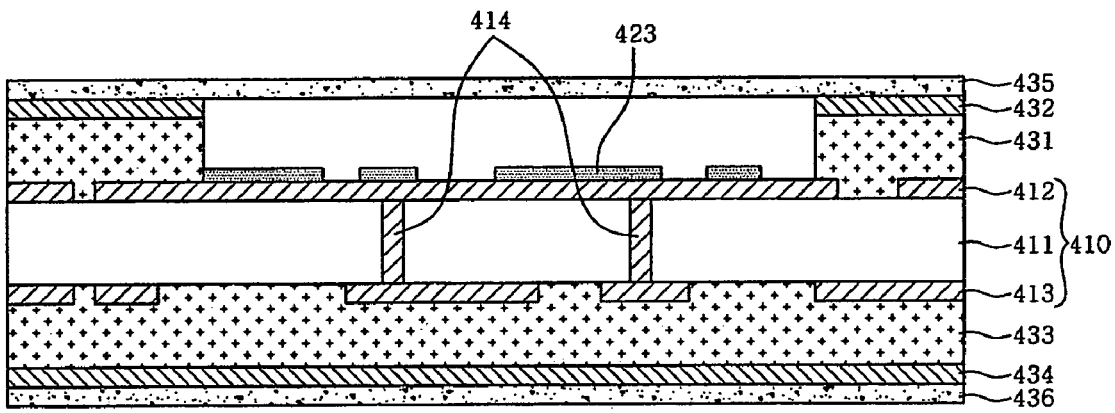
Figure 4M:
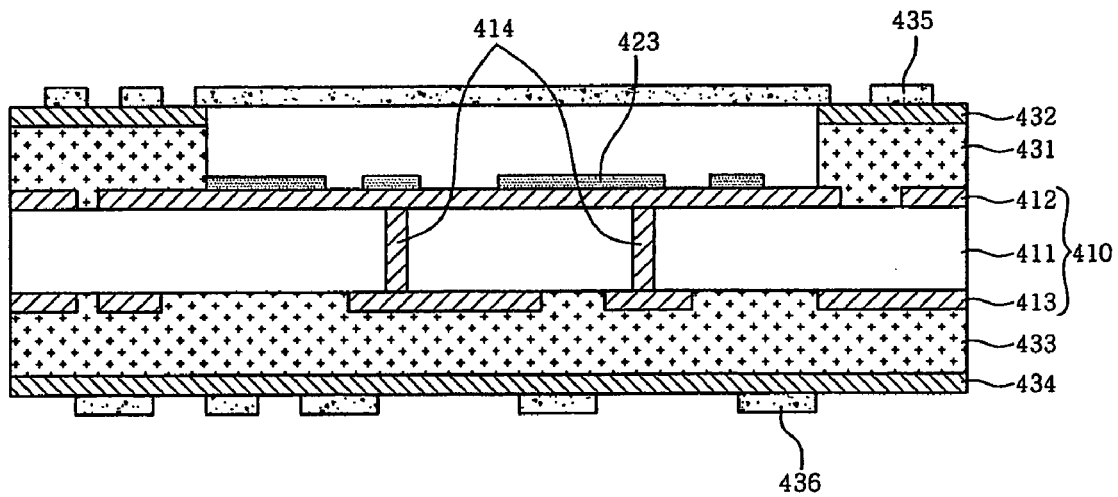
Figure 4N:
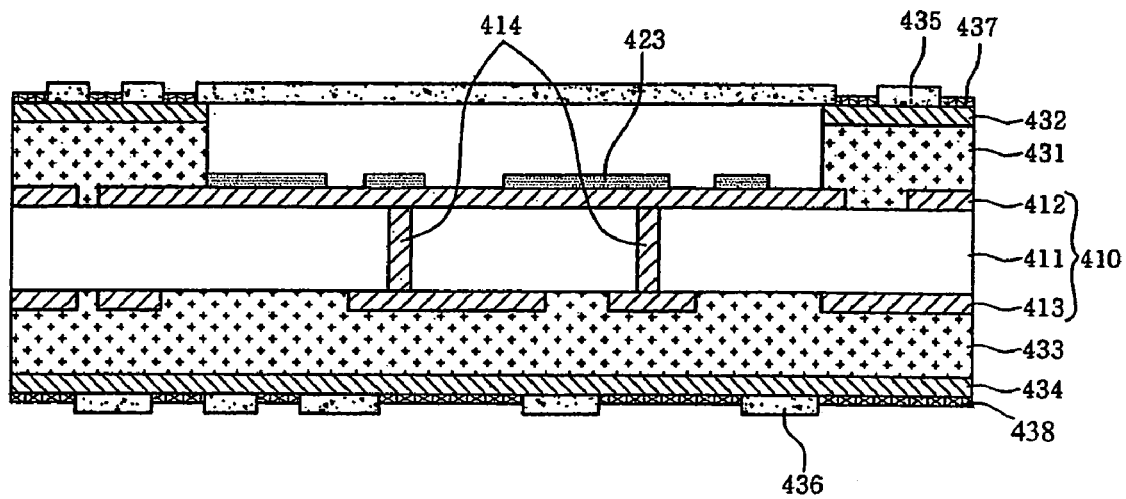
Figure 4O:
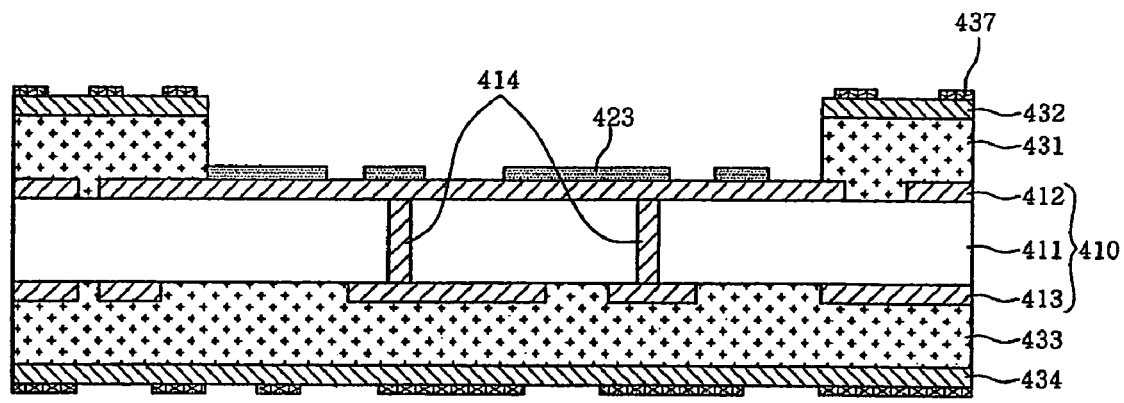
Figure 4P:
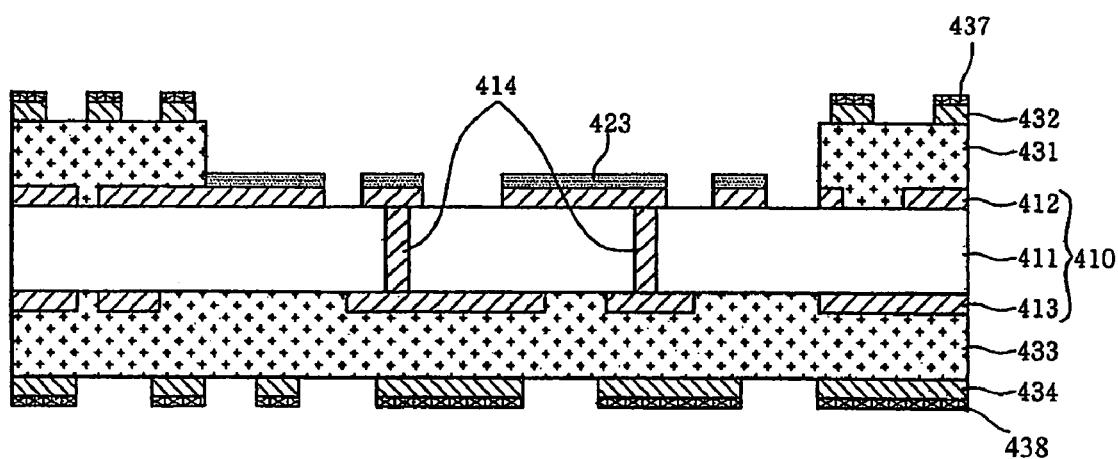
Figure 4Q:
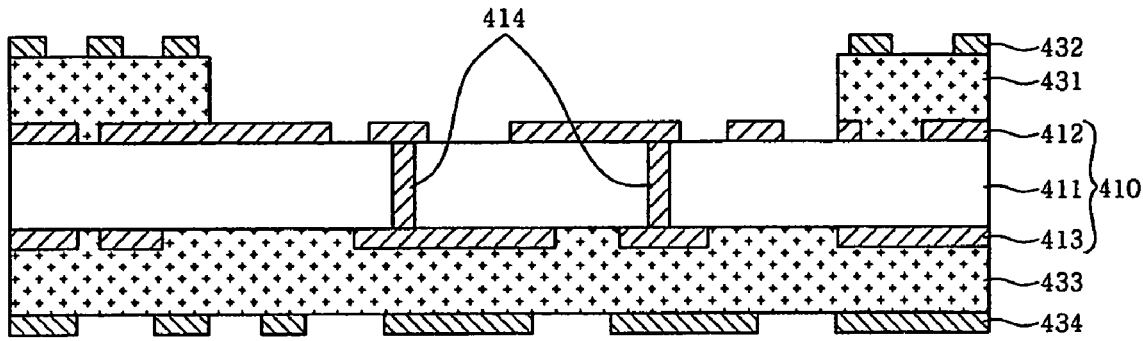

FIGS. 4a to 4q are sectional views illustrating the fabrication of a PCB having a chip package mounted thereon according to another embodiment of the present invention.

Referring to FIG. 4a, a circuit substrate 410 acting as a core is provided. The circuit substrate 410 is made of an insulating material, and comprises an insulating layer 411, having a predetermined thickness, and copper foil layers 412, 413 positioned on upper and lower sides of the insulating layer 411. Furthermore, a plurality of through holes 414 is formed through the circuit substrate 410 to connect circuits on both sides of the circuit substrate to each other.

With reference to FIGS. 4b and 4c, photosensitive substances 421, 422 are applied on the copper foil layers 412, 413 of the circuit substrate 410. Subsequently, the photosensitive substances 421, 422 are selectively removed through exposure and development processes to expose a portion of the upper copper foil layer 412, which is not to be removed, thereby forming a portion on which the chip package is to be mounted.

Referring to FIG. 4d, an etching resistor 423, which is capable of being used as a resistor during a copper etching process using gold or nickel, is applied on the exposed portion of the copper foil layer so as to prevent the copper foil layer from being etched when the copper etching process is conducted using gold or nickel, thereby providing an electric connection to the chip package to be mounted. At this time, it is preferable to form the etching resistor 423 through a plating process.

Referring to FIG. 4e, the photosensitive substances 421, 422 are removed from both sides of the copper foil layers 412, 413 using a stripping process, and photosensitive substances 424, 425 are further applied to form a circuit as shown in FIG. 4f.

At this stage, a portion of the photosensitive substances 424, 425, corresponding in position to an area in which the chip package is to be mounted, is not etched. However, the remaining portion, under which the copper foil layer is to be etched, is exposed and developed to expose a portion of the copper foil layer to be etched, as shown in FIG. 4g.

As shown in FIG. 4h, after a circuit pattern of the copper foil is formed using circuit patterns of the photosensitive substances 424, 425 as an etching resist, the photosensitive substances 424, 425 as the etching resist are stripped to complete the formation of the circuit pattern of the copper foil.

Next, after an etching process is conducted as shown in FIG. 4i to form a circuit on an internal layer, the photosensitive substances 424, 425 are removed through a stripping process, and a plurality of insulating layers 431, 433 and circuit layers 432, 434 are further formed.

As shown in FIG. 4j, in order to remove a portion of the insulating layer 431 corresponding in position to an area in which the chip package is to be mounted, a portion of the copper foil, which is positioned on such portion of the insulating layer 431, is removed through a process using a laser or a plasma.

Subsequently, after a portion of the copper foil, corresponding in position to an area in which the chip package is to be mounted, is removed as shown in FIG. 4k, a portion of the insulating layer 431, corresponding in position to an area in which the chip package is to be mounted, is removed through a process, using a laser or a plasma, capable of removing the insulating layer 431. At this stage, if necessary, it is preferable to control the removal of the insulating layer so as to prevent the resulting substrate from being excessively removed. Additionally, it is preferable that the material of the insulating layer, which is to be removed, be different from that of the insulating layer, which must not be removed, so as to prevent the insulating layer, which must not be removed, from being etched.

As shown in FIG. 4l, photosensitive materials 435, 436 are applied to form circuits on the outermost layers 432, 434.

As shown in FIG. 4m, the photosensitive materials 435, 436 are exposed and developed to form circuit patterns thereon. At this stage, a portion of the photosensitive materials 435, 436, corresponding in position to an area in which the chip package is to be mounted, is not removed.

As shown in FIG. 4n, etching resistors 437, 438 are applied on the circuit patterns formed on the photosensitive materials 435, 436 using exposure and development processes. At this stage, it is preferable that the application of the etching resistors 437, 438 be conducted by a plating process.

As shown in FIG. 4o, the photosensitive materials 435, 436 are removed so as to form wire patterns on the copper foil using the circuit patterns of the etching resistors 437, 438 as an etching resist.

As shown in FIG. 4p, after the photosensitive materials 435, 436 are removed through a stripping process, circuits are formed on a surface of the resulting substrate and the copper foils 412, 413, 432, 434 of the internal layer through an etching process employing the etching resistors 437, 438 as the etching resist.

As shown in FIG. 4q, after the etching resistors 437, 438 are completely removed through a stripping process, the chip package is mounted on the surface of the internal layer of the substrate. In case that the etching resistor 423 formed on the internal layer must be removed as shown in FIG. 4q, the removal may be conducted through an etching resistor stripping process. However, if the etching resistor is formed by a gold plating, it is preferable that the etching resistor not be removed.

FIGS. 5a to 5k are sectional views illustrating the fabrication of a PCB having a chip package mounted thereon according to another embodiment of the present invention.

Figure 5A:
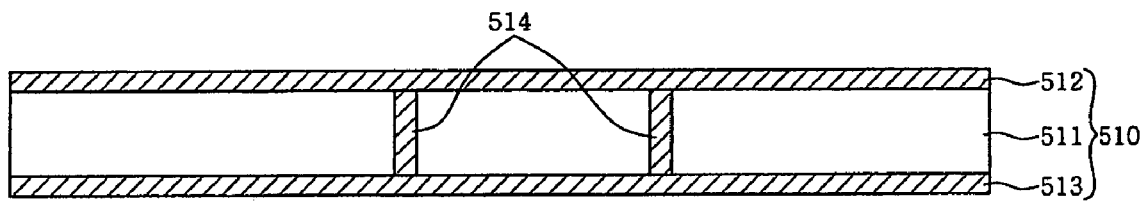
FIGS. 5a to 5k are sectional views illustrating the fabrication of a PCB having a chip package mounted thereon according to another embodiment of the present invention.

Referring to FIG. 5a, a circuit substrate 510 acting as a core is provided. The circuit substrate 510 is made of an insulating material, and comprises an insulating layer 511, having a predetermined thickness, and copper foil layers 512, 513 positioned on upper and lower sides of the insulating layer 511. Furthermore, a plurality of through holes 514 is formed through the circuit substrate 510 to connect circuits on both sides of the circuit substrate to each other.

Figure 5B:
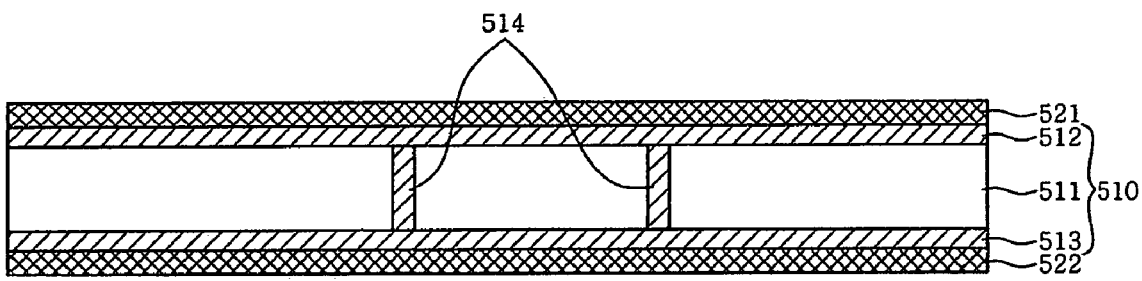
Figure 5C:
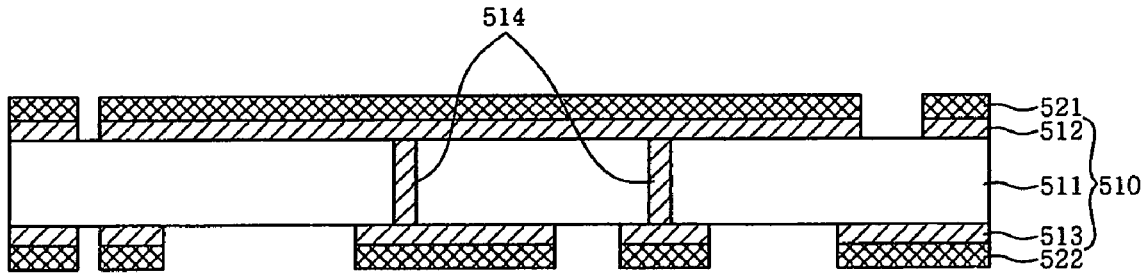

With reference to FIGS. 5b and 5c, photosensitive substances 521, 522 are applied on the copper foil layers 512, 513 of the circuit substrate 510. Subsequently, circuit patterns are formed on a portion of the photosensitive substances 521, 522, corresponding in position to an area in which the chip package is not mounted, through a photolithography process, and another circuit patterns are formed on the copper foil layers 512, 513 using the photosensitive substances 521, 522 as an etching resist.

Figure 5D:
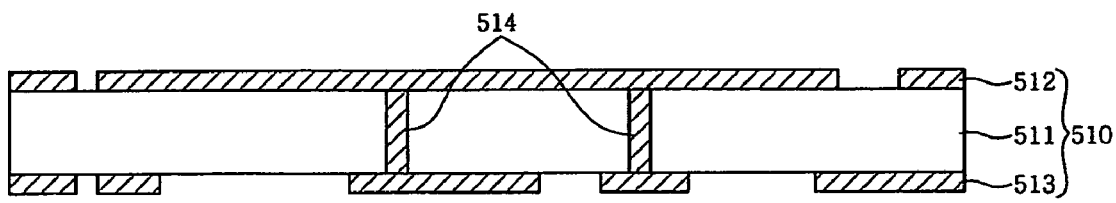
Figure 5E:
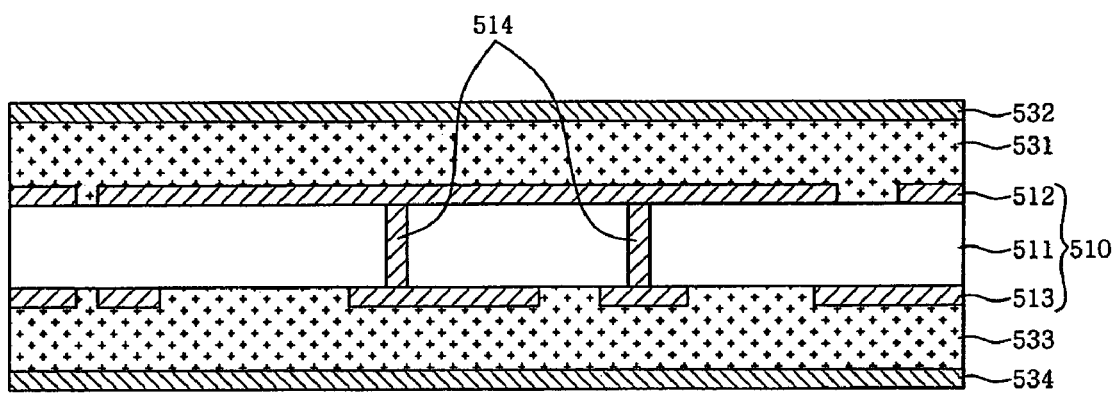

As shown in FIG. 5d, the photosensitive substances 521, 522 are removed through a stripping process, and a plurality of insulating layers 531, 533 and circuit layers 532, 534 are further formed as shown in FIG. 5e.

Figure 5F:
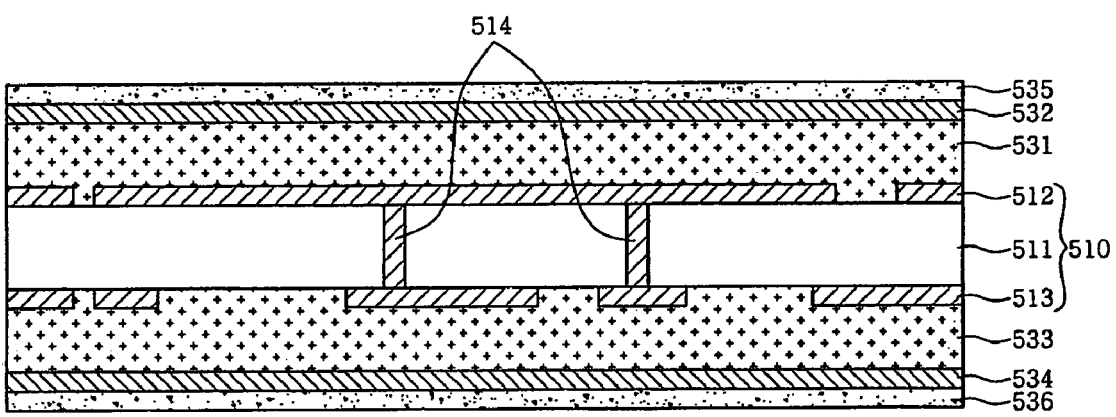

As shown in FIG. 5f, in order to remove a portion of the insulating layer 531, corresponding in position to an area in which the chip package is to be mounted, photosensitive substances 535, 536 are applied on the outermost layers 532, 534.

Figure 5G:
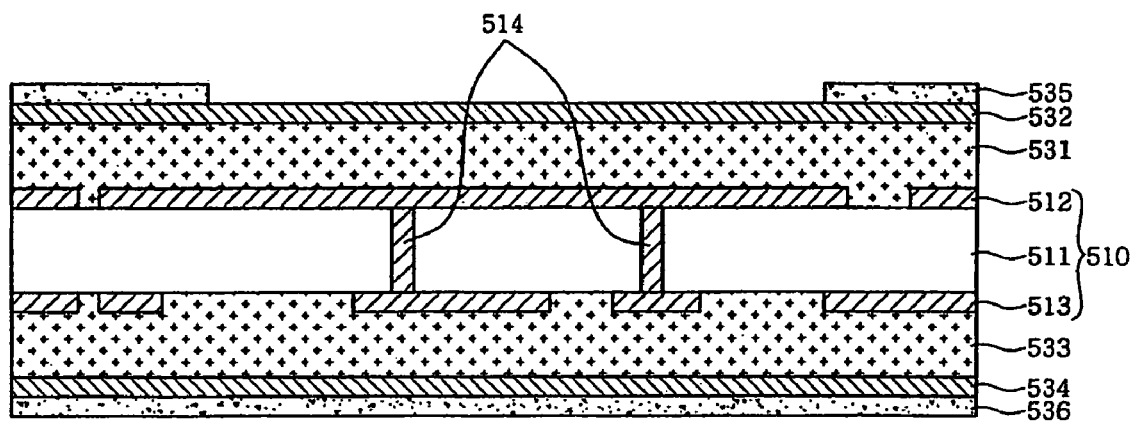

As shown in FIG. 5g, in order to remove a portion of the insulating layer 531, corresponding in position to an area in which the chip package is to be mounted, the photosensitive substance 535 is exposed and developed to be removed at a portion thereof, corresponding in position to the area in which the chip package is to be mounted. Subsequently, an etching process is conducted to remove a portion of the copper foil layer 532 of the outermost layer, corresponding in position to the area in which the chip package is to be mounted.

Figure 5H:
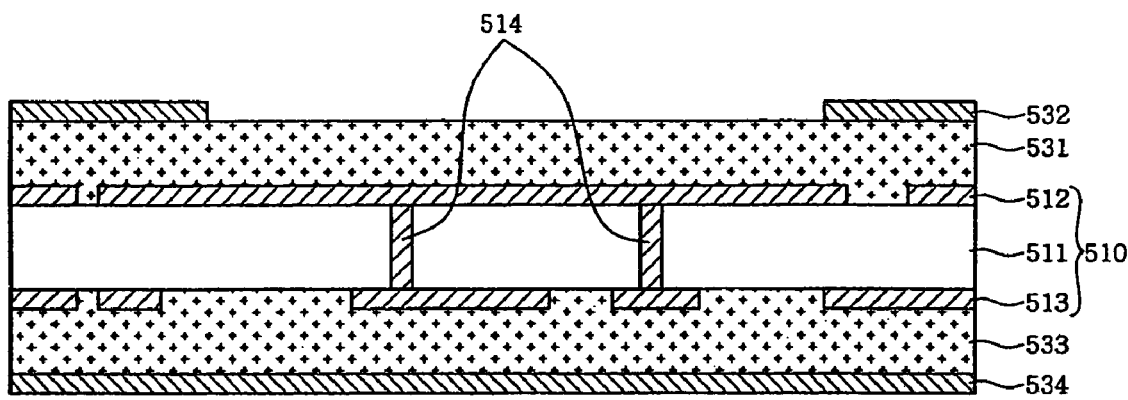

After the function of the photosensitive substance 531 is completed, the photosensitive substance is removed by a stripping process as shown in FIG. 5h. Subsequently, a portion of the insulating layer 531, corresponding in position to an area in which the chip package is to be mounted, is removed through a process, using a laser or a plasma, capable of removing the insulating layer 531. Furthermore, photosensitive materials 537, 538 are applied on a surface of the resulting substrate to form circuits on external layers.

Figure 5I:
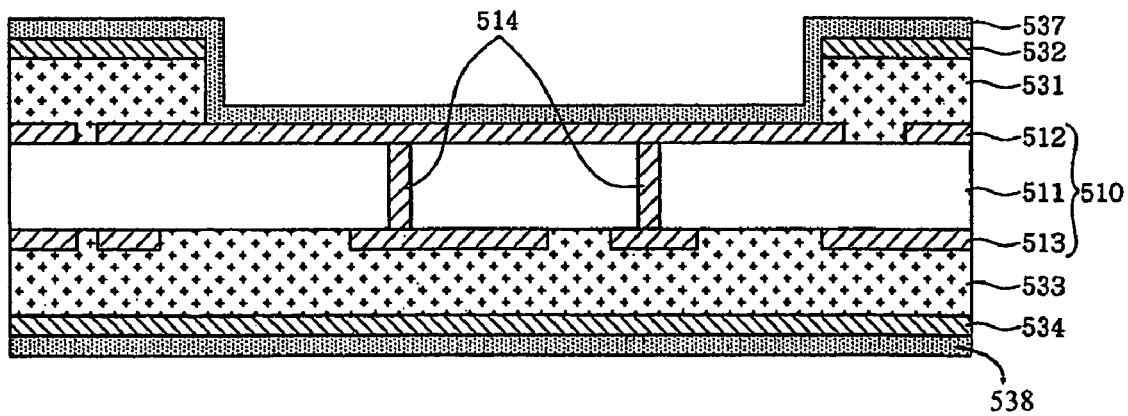

As shown in FIG. 5i, circuits are formed on the photosensitive materials 537, 538 through exposure and development processes. At this time, in the exposure process, a portion of the photosensitive materials 537, 538, corresponding in position to an area in which the copper foil must not be removed, may be hardened using radiation that travels very straight, such as UV radiation, X-rays, or a laser.

Figure 5J:
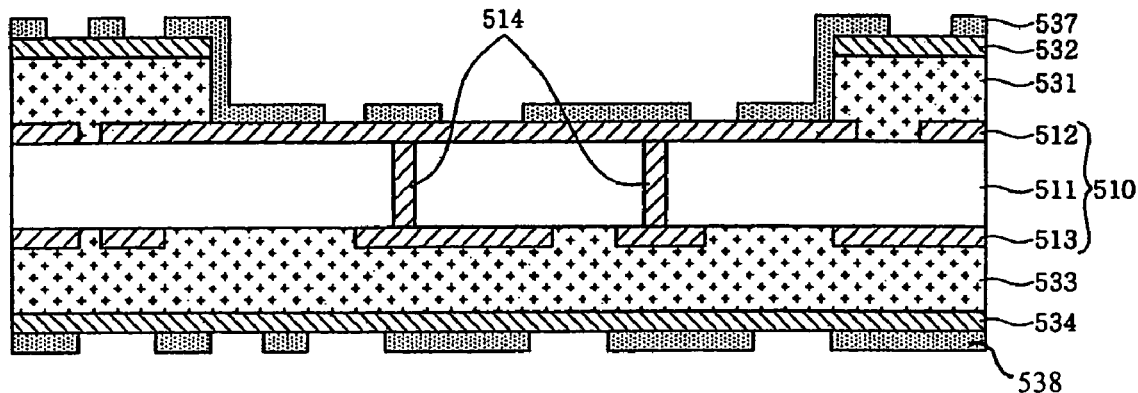

As well, as shown in FIG. 5j, the copper foil 532 on a surface of the resulting substrate, and the copper foil 512 of the internal layer, on which the chip package is to be mounted, are simultaneously etched through an etching process employing the photosensitive materials 537, 538 as an etching resist.

Figure 5K:
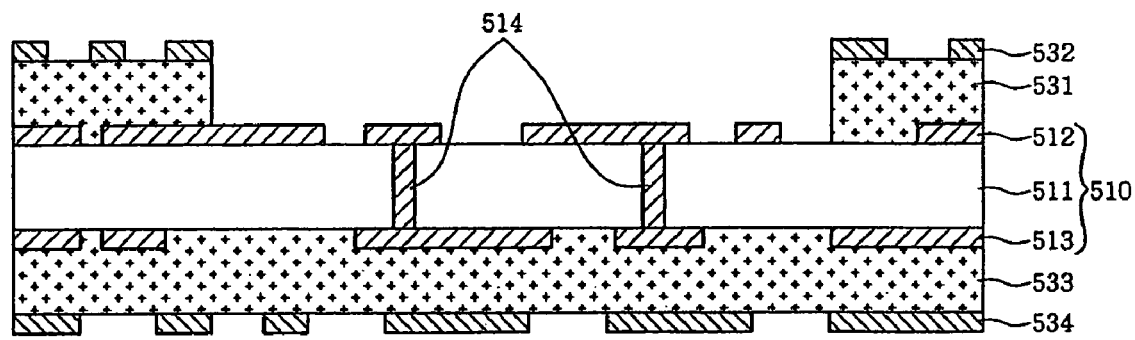

As shown in FIG. 5k, after the photosensitive materials are completely removed through a stripping process, the chip package is mounted on a surface of the internal layer of the substrate.

FIGS. 6a to 6l are sectional views illustrating the fabrication of a PCB having a chip package mounted thereon according to another embodiment of the present invention.

Figure 6A:
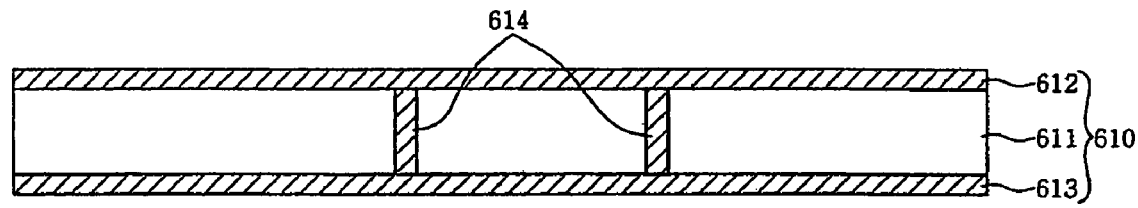
FIGS. 6a to 6l are sectional views illustrating the fabrication of a PCB having a chip package mounted thereon according to a further embodiment of the present invention.

Referring to FIG. 6a, a circuit substrate 610 acting as a core is provided. The circuit substrate 610 is made of an insulating material, and comprises an insulating layer 611, having a predetermined thickness, and copper foil layers 612, 613 positioned on upper and lower sides of the insulating layer 611. Furthermore, a plurality of through holes 614 is formed through the circuit substrate 610 to connect circuits on both sides of the circuit substrate to each other.

Figure 6B:
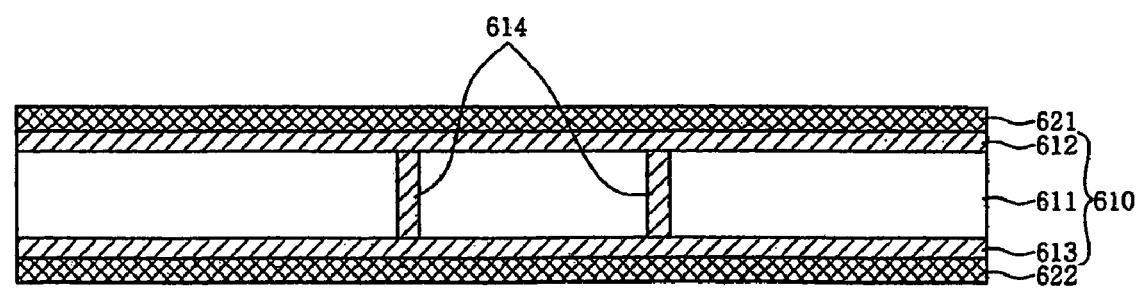
Figure 6C:
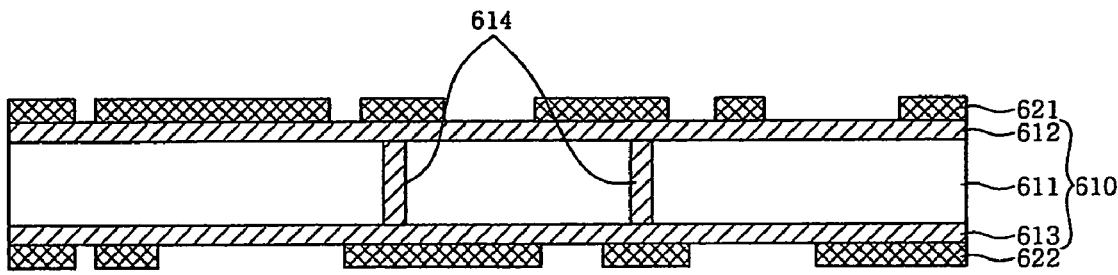
Figure 6D:
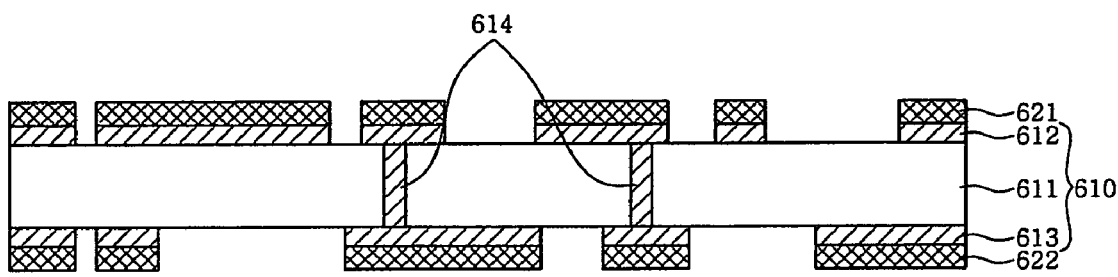

With reference to FIGS. 6b to 6d, photosensitive substances 621, 622 are applied on the copper foil layers 612, 613 of the circuit substrate 610. Subsequently, circuit patterns are formed on the photosensitive substances 621, 622 through a photolithography process, and other circuit patterns are then formed on the copper foil layers 612, 613 using the photosensitive substances 621, 622 as an etching resist. Thereby, the circuit patterns are formed on a portion of the internal layers 612, 613, corresponding in position to an area in which the chip package is to be mounted, and another portion of the internal layers.

Figure 6E:
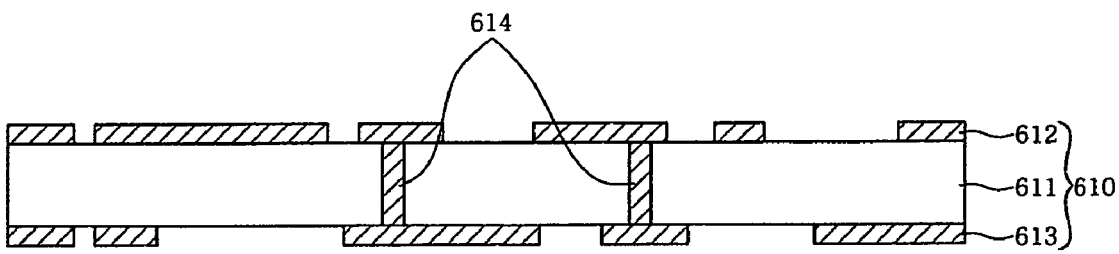
Figure 6F:
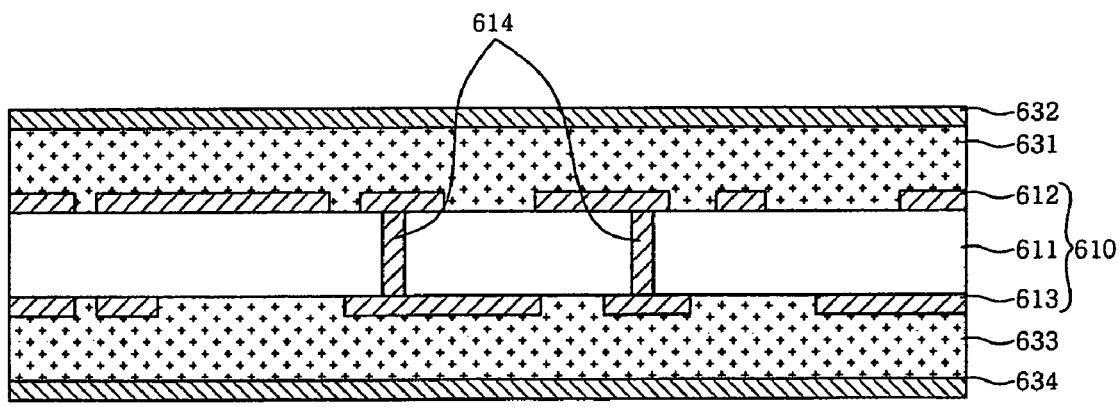

As shown in FIG. 6e, the photosensitive substances 621, 622 are removed through a stripping process, and a plurality of insulating layers 631, 633 and circuit layers 632, 634 is further formed as shown in FIG. 6f.

Figure 6G:
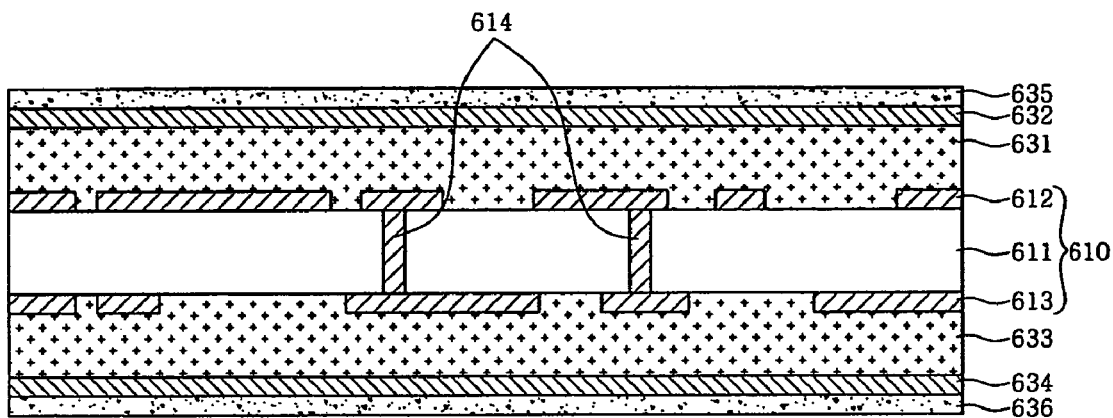

As shown in FIG. 6g, in order to remove a portion of the insulating layer 631, corresponding in position to an area in which the chip package is to be mounted, photosensitive substances 635, 636 are applied on the outermost layers 632, 634.

Figure 6H:
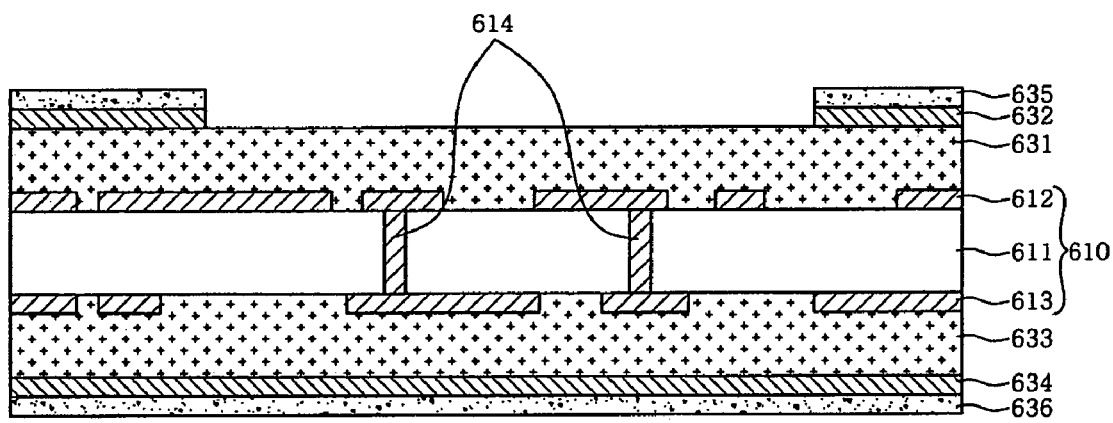

As shown in FIG. 6h, in order to remove a portion of the insulating layer 631, corresponding in position to an area in which the chip package is to be mounted, the photosensitive substance 635 is exposed and developed to be removed at a portion thereof, corresponding in position to the area in which the chip package is to be mounted. Subsequently, an etching process is conducted to remove a portion of the copper foil layer 632 of the outermost layer, corresponding in position to the area in which the chip package is to be mounted.

Figure 6I:
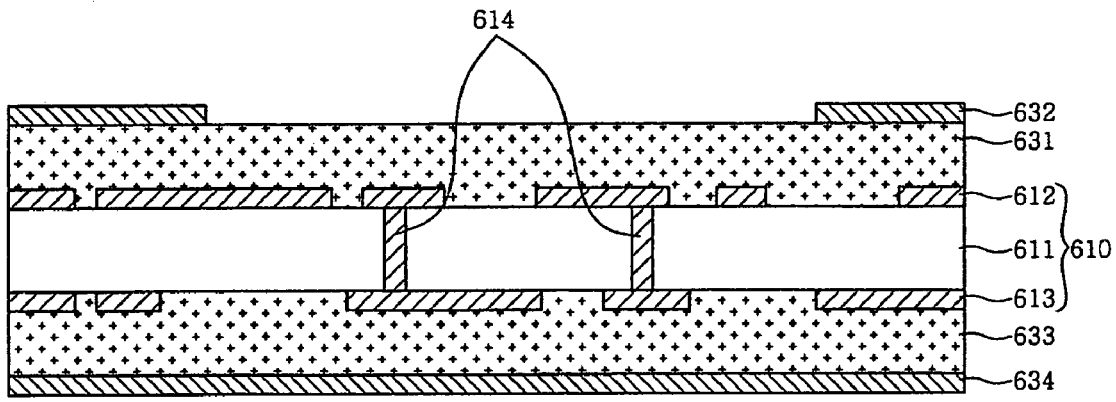
Figure 6J:
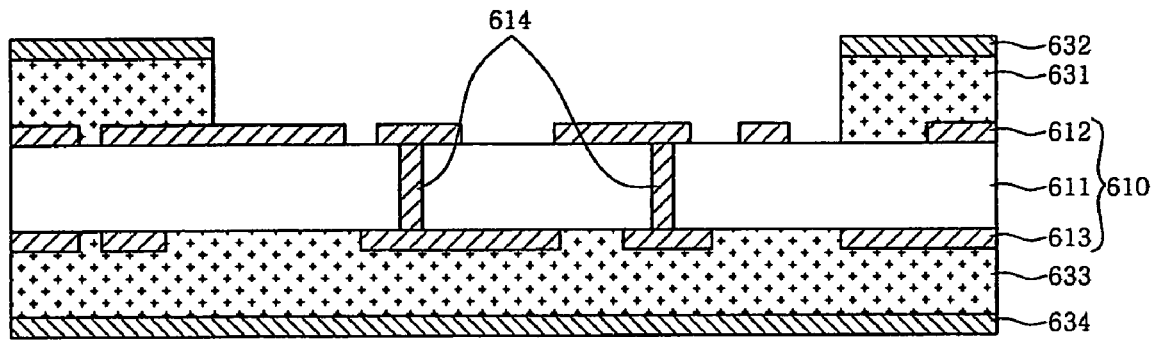

After the function of the photosensitive substance 635 is completed, the photosensitive substance is removed through a stripping process as shown in FIG. 6i. Subsequently, as shown in FIG. 6j, a portion of the insulating layer 631, corresponding in position to an area in which the chip package is to be mounted, is removed through a process capable of removing the insulating layer 631 using a laser or a plasma.

Figure 6K:
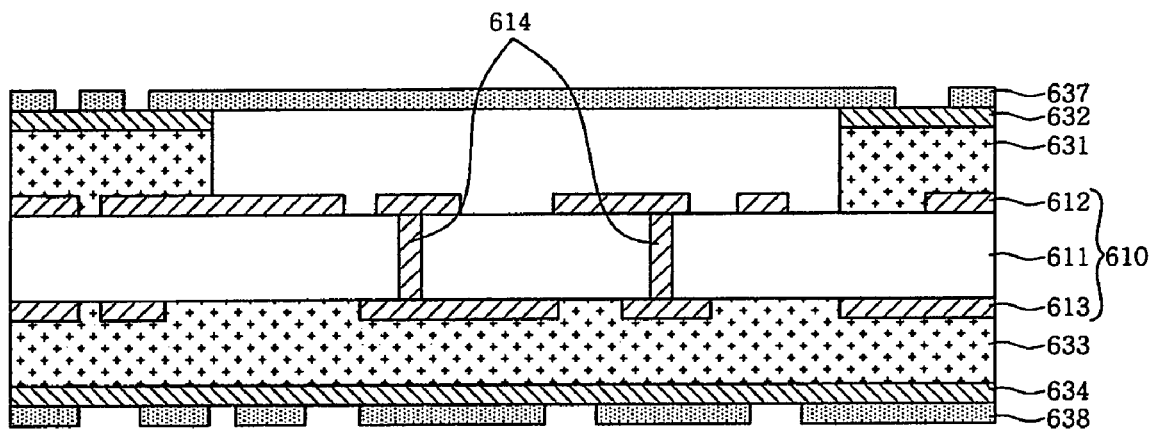

As shown in FIG. 6k, photosensitive materials 637, 638 are applied on a surface of the resulting substrate, and exposure and development processes are then conducted to form circuit patterns on external layers. Since the circuit pattern is already formed on the internal layer 612, on which the chip package is to be mounted, the circuit patterns are formed on a portion of the external layers, on which the chip package is not to be mounted. At this time, in the exposure process, a portion of the photosensitive materials 637, 638, corresponding in position to an area in which the copper foil must not be removed, may be hardened using radiation that travels very straight, such as UV radiation, X-rays, or a laser.

Figure 6L:
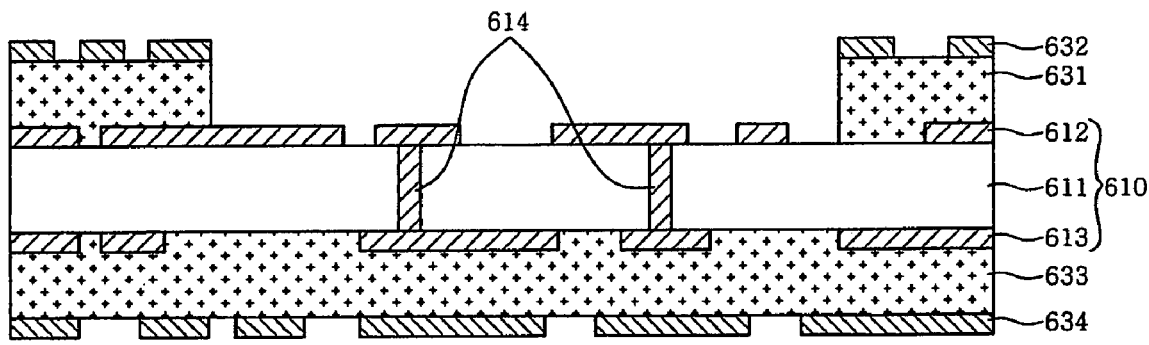

As shown in FIG. 6l, after the copper foil 632 on a surface of the resulting substrate is etched through an etching process employing the photosensitive materials 637, 638 as an etching resist, and the photosensitive materials are completely removed through a stripping process, the chip package is mounted on a surface of the internal layer of the substrate.

FIGS. 7a to 7l are sectional views illustrating the fabrication of a PCB having a chip package mounted thereon according to another embodiment of the present invention.

Figure 7A:
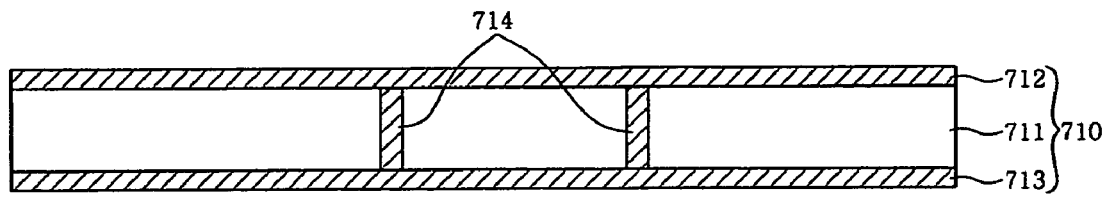
FIGS. 7a to 7l are sectional views illustrating the fabrication of a PCB having a chip package mounted thereon according to another embodiment of the present invention.

Referring to FIG. 7a, a circuit substrate 710 acting as a core is provided. The circuit substrate 710 is made of an insulating material, and comprises an insulating layer 711, having a predetermined thickness, and copper foil layers 712, 713 positioned on upper and lower sides of the insulating layer 711. Furthermore, a plurality of through holes 714 is formed through the circuit substrate 710 to connect circuits on both sides of the circuit substrate to each other.

Figure 7B:
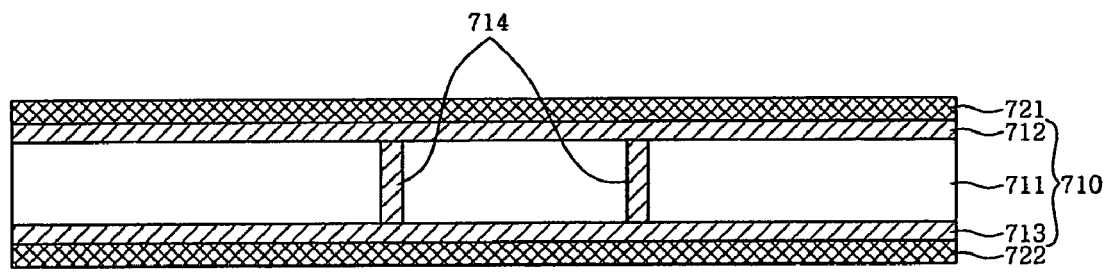
Figure 7C:
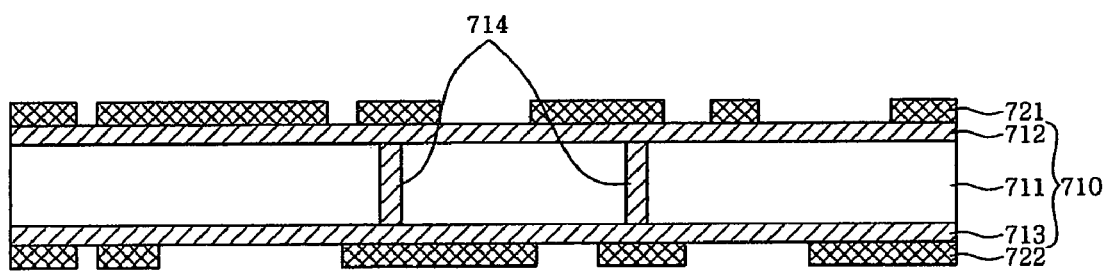
Figure 7D:
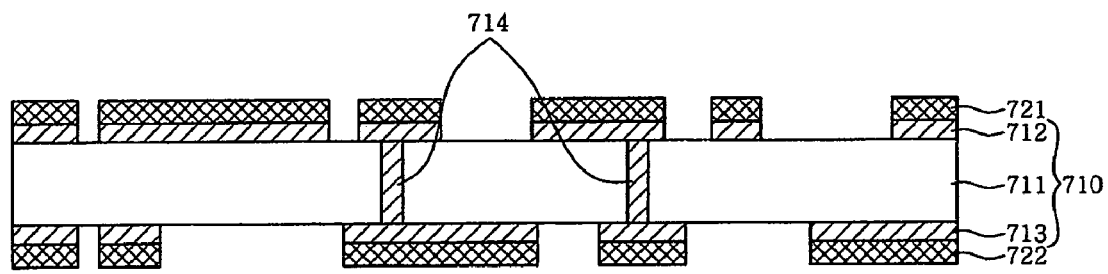

With reference to FIGS. 7b to 7d, photosensitive substances 721, 722 are applied on the copper foil layers 712, 713 of the circuit substrate 710. Subsequently, circuit patterns are formed on the photosensitive substances 721, 722 through a photolithography process, and other circuit patterns are then formed on the copper foil layers 712, 713 using the photosensitive substances 721, 722 as an etching resist. Thereby, the circuit patterns are formed on a portion of the internal layers 712, 713, corresponding in position to an area in which the chip package is to be mounted, and another portion of the internal layers.

Figure 7E:
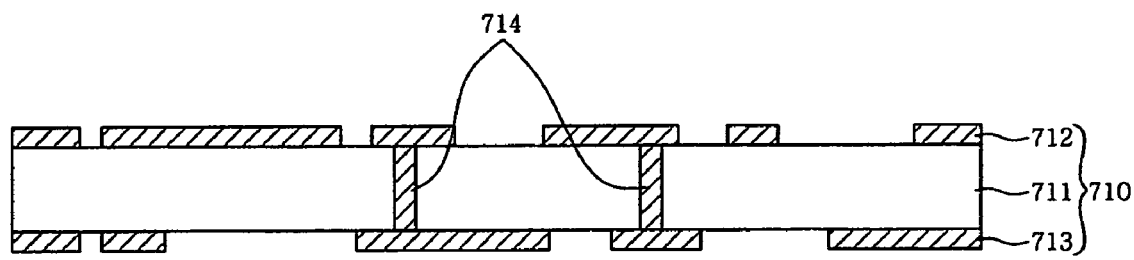

As shown in FIG. 7e, the photosensitive substances 721, 722 are removed through a stripping process.

Figure 7F:
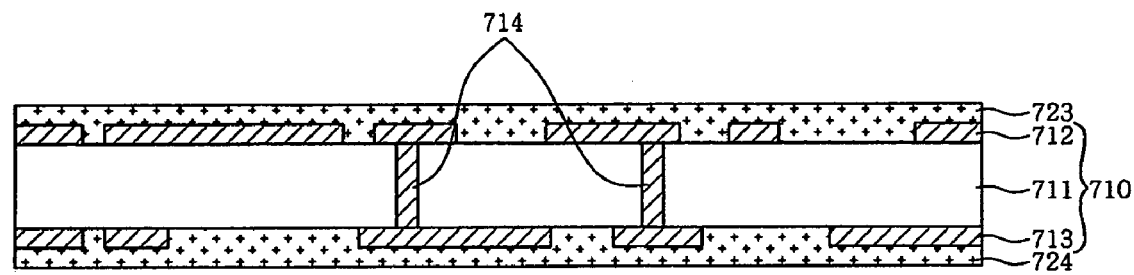

As shown in FIG. 7f, photosensitive substances 723, 724 are applied to achieve the selective application of an etching resistor 725.

Figure 7G:
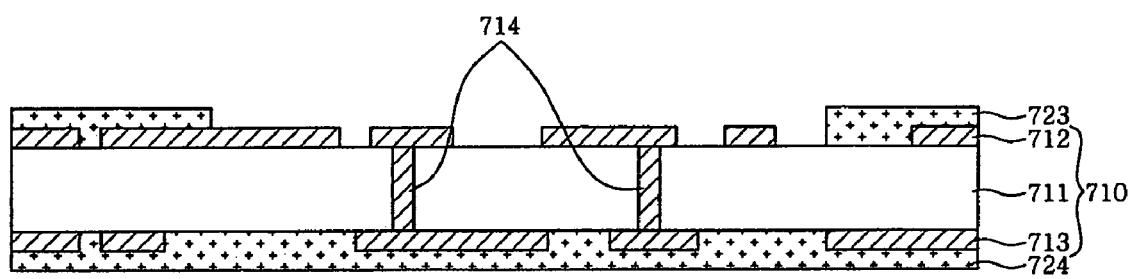

As shown in FIG. 7g, the photosensitive substance 723 is exposed and developed to expose a portion on which the etching resistor 725 is to be applied.

Figure 7H:
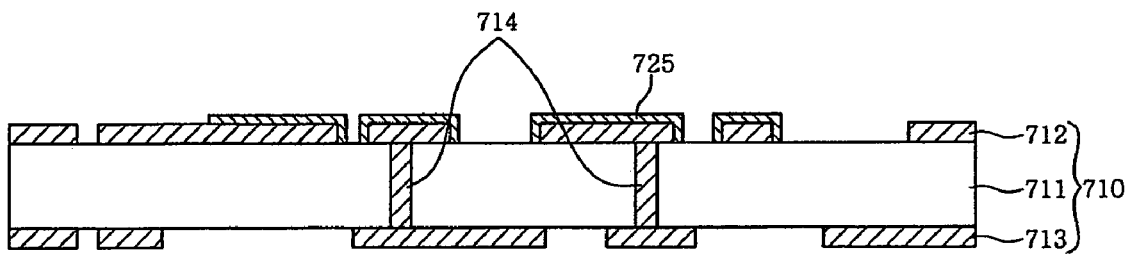

As shown in FIG. 7h, after the etching resistor 725 is applied, the photosensitive substances 723, 724 are removed through a stripping process. At this stage, it is preferable that the application of the etching resistor 725 be conducted using a plating process.

Figure 7I:
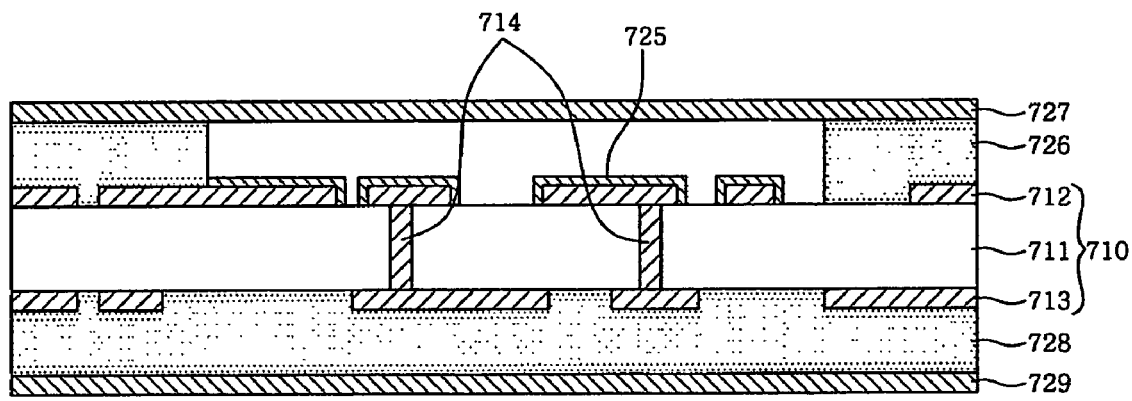

As shown in FIG. 7i, a plurality of insulating layers 726, 728 and circuit layers 727, 729 are further formed. In this regard, a portion of the insulating layer 726, in which the chip package is to be mounted, is already removed, and a portion of the copper foil layer 727, corresponding in position to that portion of the insulating layer, remains. Accordingly, it is unnecessary to etch that portion of the insulating layer 726 to mount the chip package in the insulating layer.

Figure 7J:
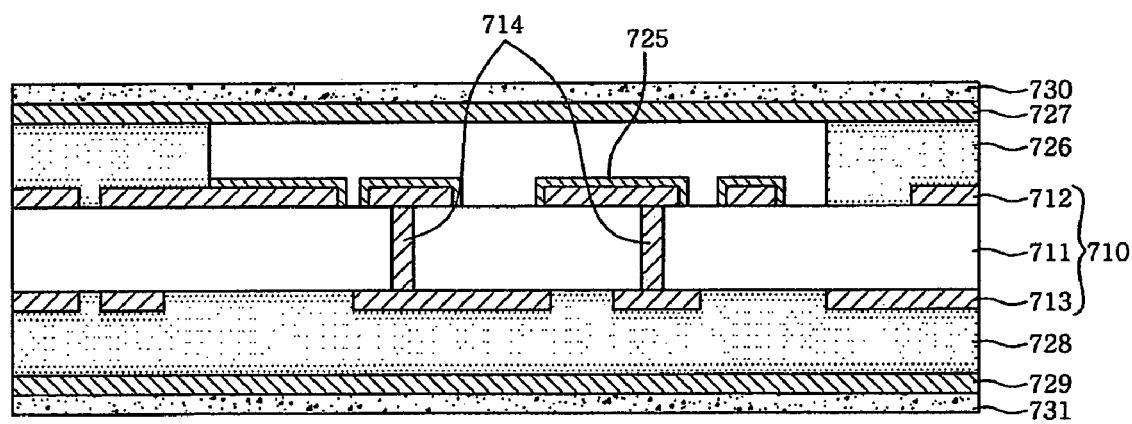

As shown in FIG. 7j, photosensitive substances 730, 731 are applied on the outermost layers 727, 729 to form a circuit pattern on the outermost layer 727.

Figure 7K:
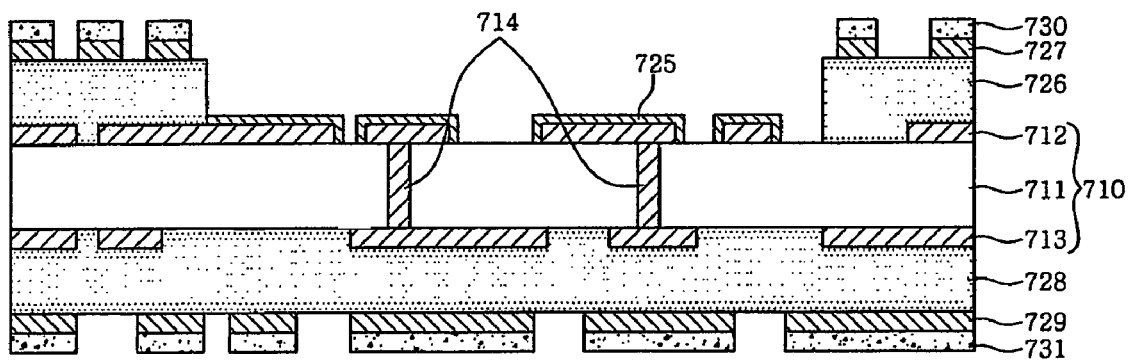

As shown in FIG. 7k, the photosensitive substance 730 is exposed and developed to be removed at a portion thereof, which corresponds in position to the circuit pattern of the outermost layer 727, so as to form the circuit pattern on the outermost layer 727. At this stage, a portion of the photosensitive substance 730, corresponding in position to an area in which the chip package is to be mounted, is completely removed.

Furthermore, an etching process is conducted using the photosensitive substance 730 as an etching resist to remove a portion of the copper foil layer 727 of the outermost layer, corresponding in position to the circuit pattern of the photosensitive substance 730.

Figure 7L:
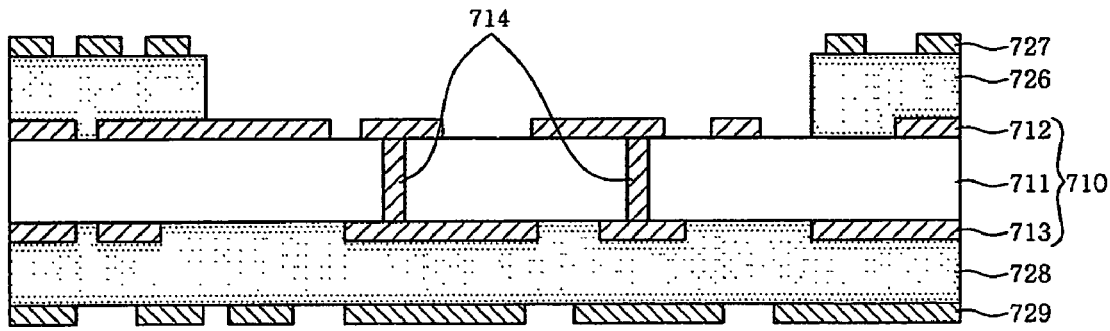

After the function of the photosensitive substance 730 is completed, the photosensitive substance is removed through a stripping process as shown in FIG. 7l. Thereby, it is possible to mount the chip package on a surface of the internal layer of the substrate.

FIGS. 8a to 8m are sectional views illustrating the fabrication of a PCB having a chip package mounted thereon according to another embodiment of the present invention.

Figure 8A:
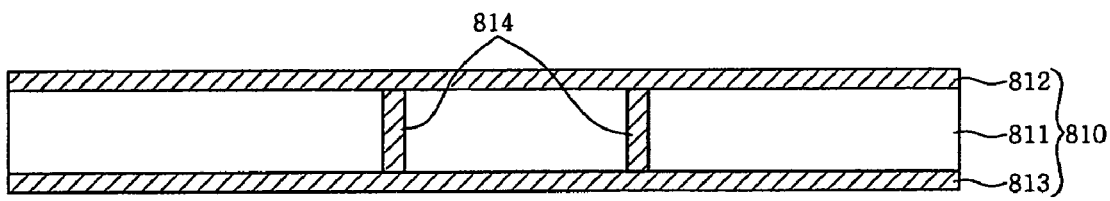
FIGS. 8a to 8m are sectional views illustrating the fabrication of a PCB having a chip package mounted thereon according to a further embodiment of the present invention.

Referring to FIG. 8a, a circuit substrate 810 acting as a core is provided. The circuit substrate 810 is made of an insulating material, and comprises an insulating layer 811, having a predetermined thickness, and copper foil layers 812, 813 positioned on upper and lower sides of the insulating layer 811. Furthermore, a plurality of through holes 814 is formed through the circuit substrate 810 to connect circuits on both sides of the circuit substrate to each other.

Figure 8B:
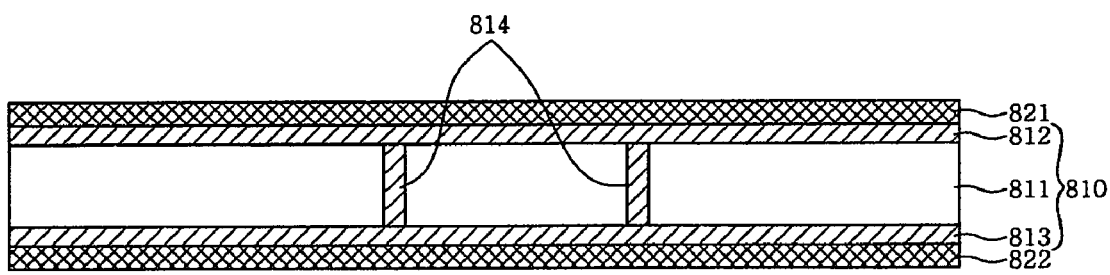
Figure 8C:
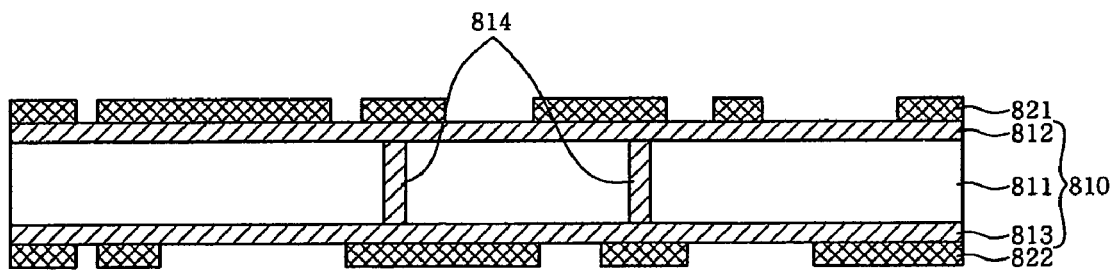
Figure 8D:
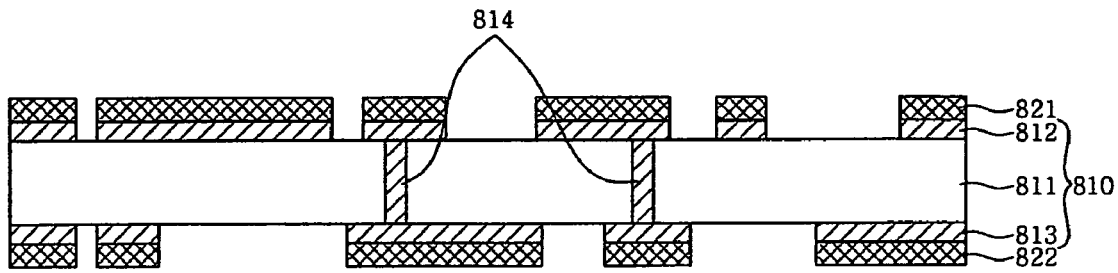

With reference to FIGS. 8b to 8d, photosensitive substances 821, 822 are applied on the copper foil layers 812, 813 of the circuit substrate 810. Subsequently, circuit patterns are formed on the photosensitive substances 821, 822 through a photolithography process, and other circuit patterns are then formed on the copper foil layers 812, 813 using the photosensitive substances 821, 822 as an etching resist. Thereby, the circuit patterns are formed on a portion of the internal layers 812, 813, corresponding in position to an area in which the chip package is to be mounted, and another portion of the internal layers.

Figure 8E:
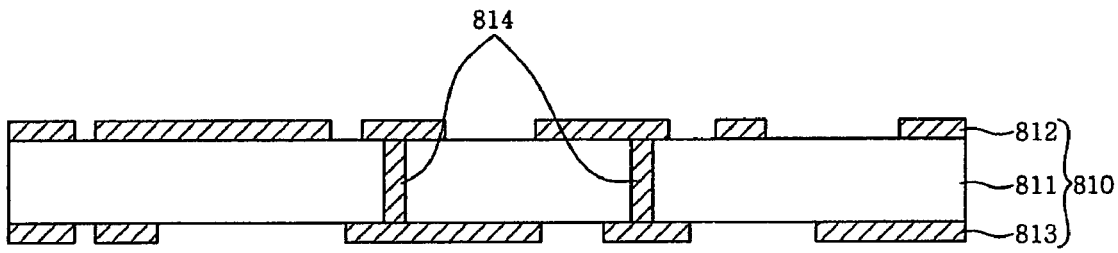

As shown in FIG. 8e, the photosensitive substances 821, 822 are removed through a stripping process.

Figure 8F:
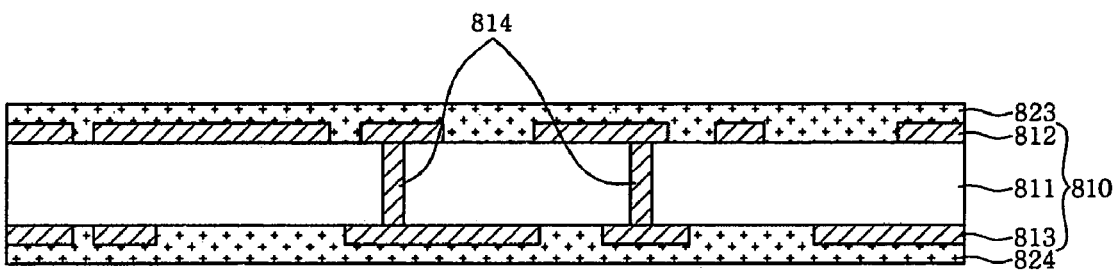

As shown in FIG. 8f, photosensitive substances 823, 824 are applied to achieve the selective application of an etching resistor 825.

Figure 8G:
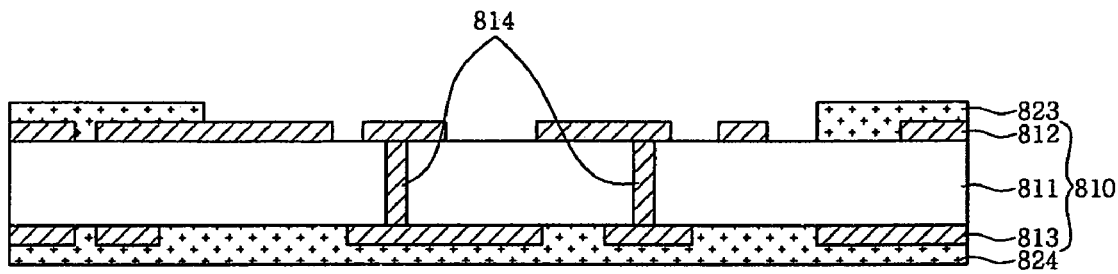

As shown in FIG. 8g, the photosensitive substance 823 is exposed and developed to expose a portion on which the etching resistor 825 is to be applied.

Figure 8H:
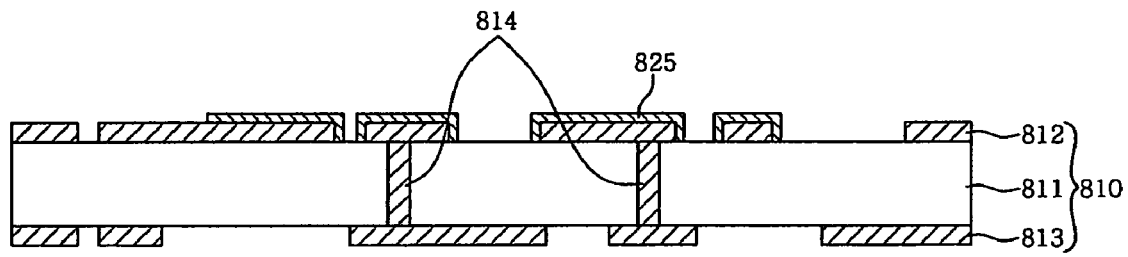

As shown in FIG. 8h, after the etching resistor 825 is applied, the photosensitive substances 823, 824 are removed through a stripping process. At this stage, it is preferable that the application of the etching resistor 825 be conducted using a plating process.

Figure 8I:
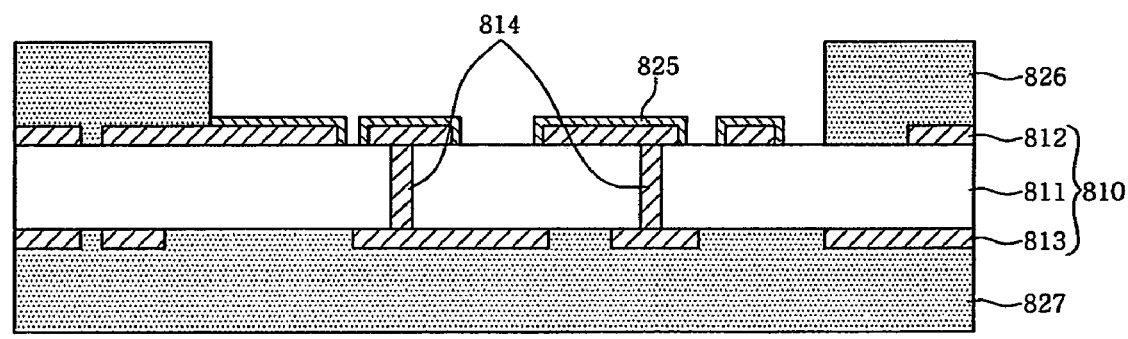

As shown in FIG. 8i, a plurality of insulating layers 826, 827 is further laminated. In this regard, a portion of the insulating layer 826, in which the chip package is to be mounted, is already removed. Accordingly, it is unnecessary to etch that portion of the insulating layer 826 to mount the chip package in the insulating layer.

Figure 8J:
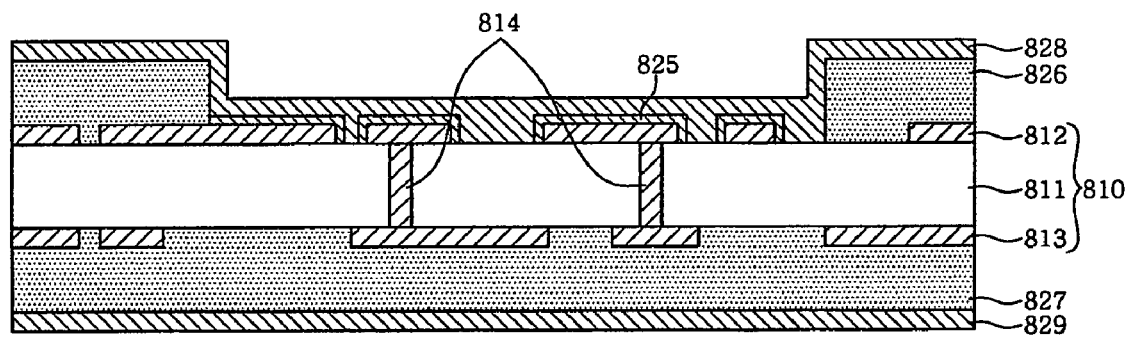

As shown in FIG. 8j, electroless and electrolytic copper plating processes are conducted to form plating layers 828, 829.

Figure 8K:
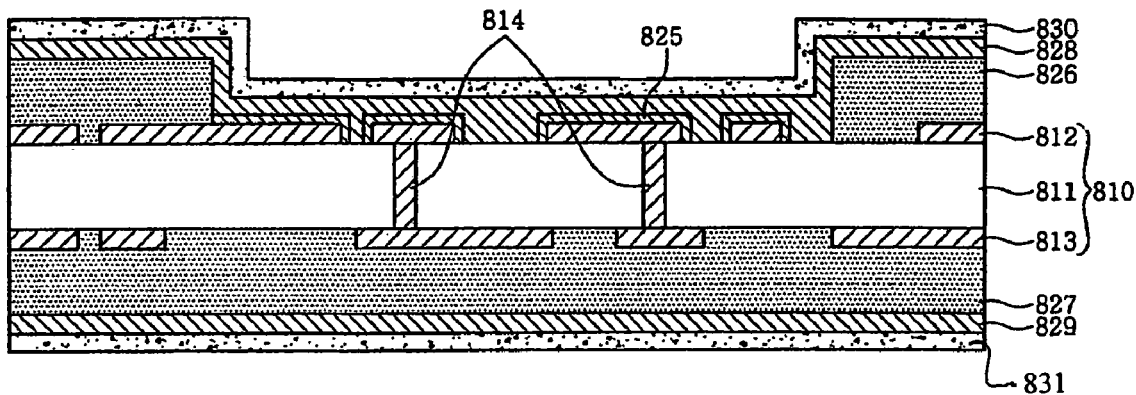

As shown in FIG. 8k, photosensitive substances 830, 831 are applied on the outermost layers 828, 829 to form circuit patterns on the plating layers 828, 829.

Figure 8L:
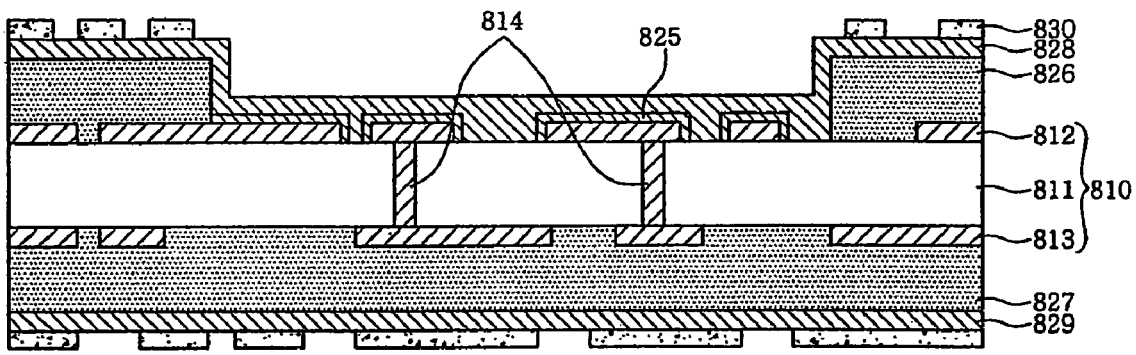

As shown in FIG. 8l, the photosensitive substance 830 is exposed and developed to be removed at a portion thereof, which corresponds in position to the circuit patterns of the plating layers 828, 829, so as to form the circuit patterns on the plating layers 828, 829. At this time, a portion of the photosensitive substance 830, corresponding in position to an area in which the chip package is to be mounted, is completely removed.

Furthermore, an etching process is conducted using the photosensitive substance 830 as an etching resist to remove a portion of the copper foil layer 828 of the outermost layer, corresponding in position to the circuit pattern of the photosensitive substance 830.

Figure 8M:
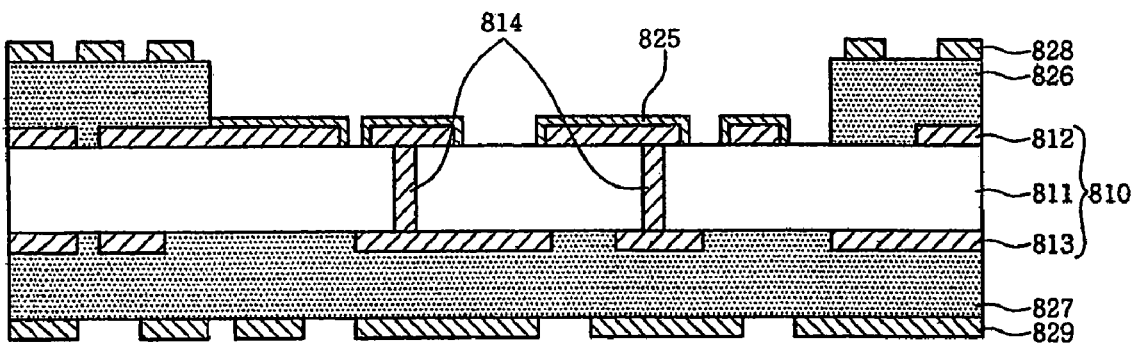

After the function of the photosensitive substance 830 is completed, the photosensitive substance is removed through a stripping process as shown in FIG. 8m. Thereby, it is possible to mount the chip package on a surface of the internal layer of the substrate.

Meanwhile, a process of FIGS. 9a to 9d may be further conducted in all the above embodiments of the present invention.

Figure 9A:
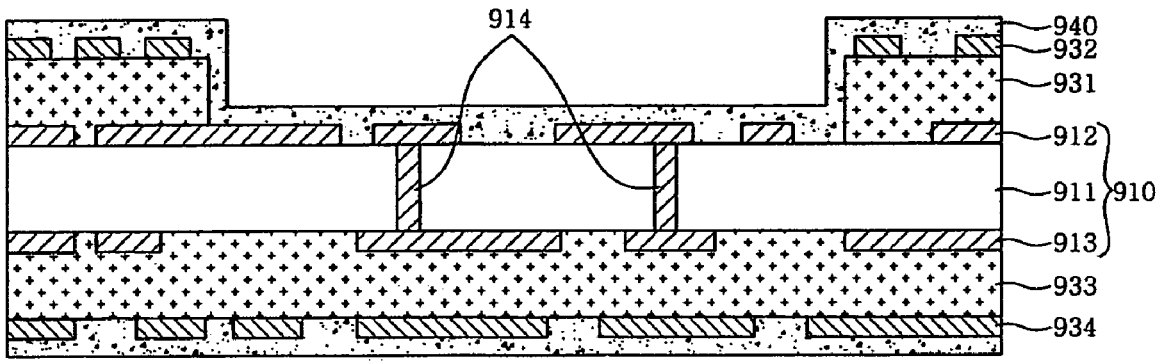
FIGS. 9a to 9d are sectional views illustrating the fabrication of a PCB having a chip package mounted thereon according to another embodiment of the present invention.
Figure 9B:
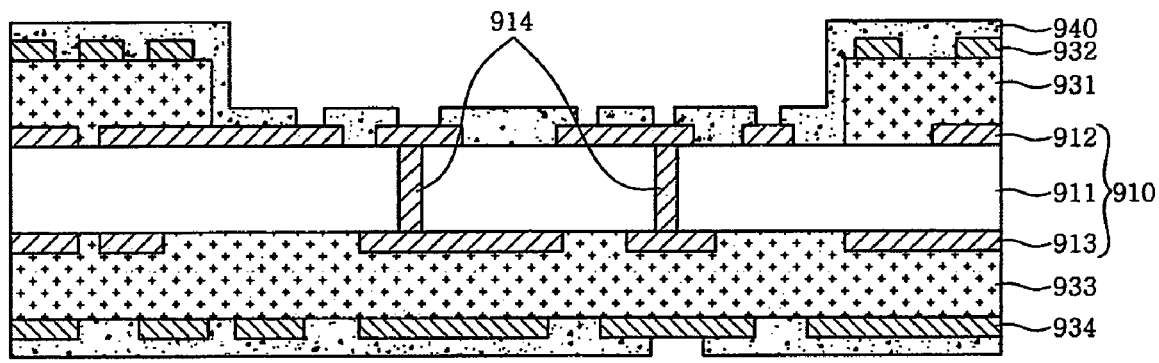
Figure 9C:
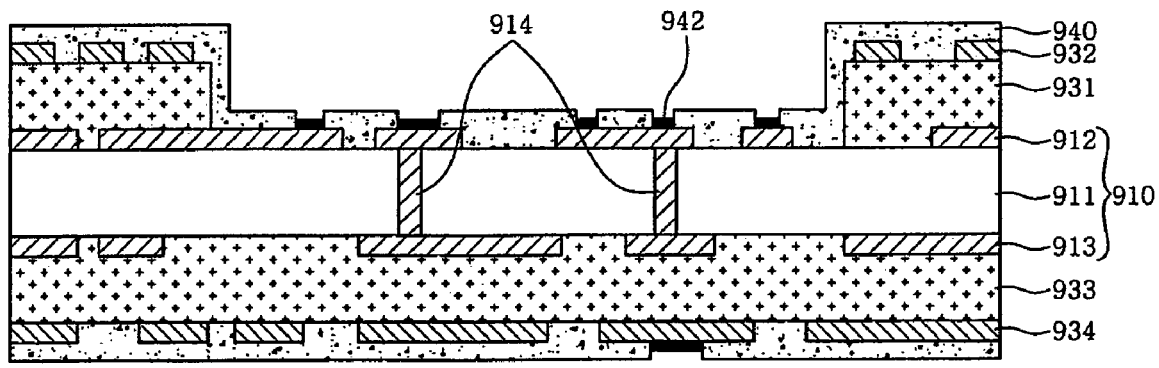

FIGS. 9a to 9c are sectional views illustrating the fabrication of a PCB having an integrated circuit chip mounted thereon according to yet another embodiment of the present invention.

Referring to FIG. 9a, a solder resist ink 940 is applied to an entire side of a PCB from which a portion of an insulating layer 931, in which a chip package is to be mounted, is removed according to the procedures of the preceding embodiments.

Figure 9D:
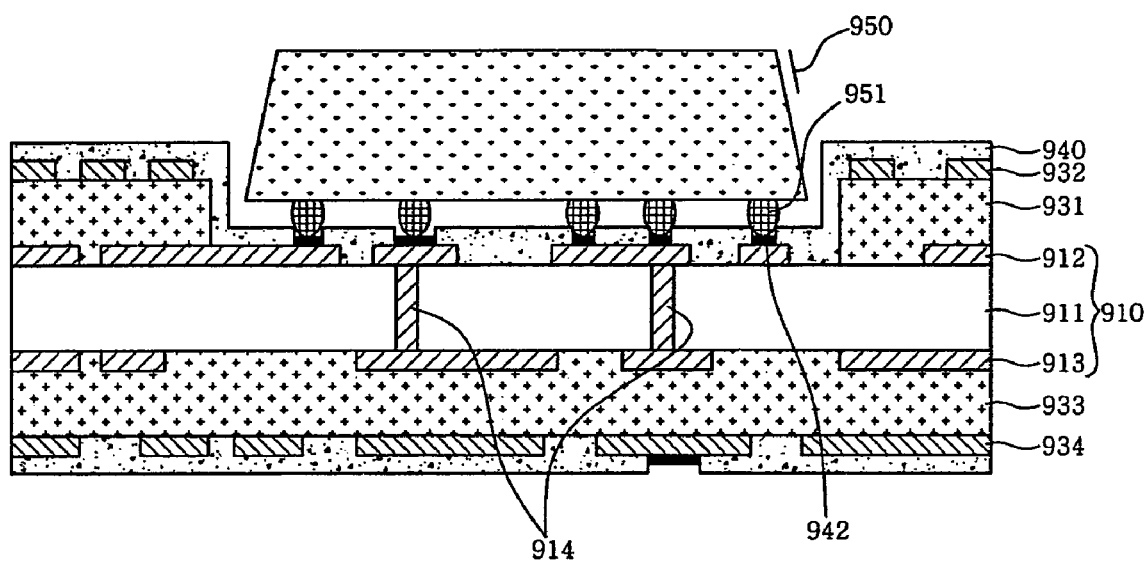

With reference to FIG. 9b, a solder resist layer 940, formed by the solder resist ink applied to the PCB, is removed at a portion thereof, which corresponds in position to solders 951 of the chip package or shown in FIG. 9d.

As shown in FIG. 9c, an electric conductive material or a nonconductive material 942 may be applied on a copper foil layer 912 partially exposed by removing a portion of the solder resist layer 940 of the PCB so as to prevent oxidation of the copper foil layer and to improve adhesion strength between parts to be mounted on the PCB and the copper foil layer. At this stage, it is preferable that the application of the material be conducted through gold plating.

As shown in FIG. 9d, the chip package 950 is mounted using a flip chip on the PCB.

The fabrication of a PCB of the present invention has been described in an illustrative manner, and it is to be understood that the terminology used is intended to be in the nature of description rather than of limitation. Many modifications and variations of the present invention are possible in light of the above teachings. Therefore, it is to be understood that within the scope of the appended claims, the invention may be practiced otherwise than as specifically described.

As described above, the present invention is advantageous in that since a finished chip package is mounted on a PCB, the required degree of cleanliness is reduced, eliminating the necessity for additional devices and costs.

Another advantage of the present invention is that since it is possible to position a chip closer to an electric power source layer, the occurrence of noise caused by interference can be reduced.

Still another advantage of the present invention is that connection is feasible through side walls of the package as well as through the bottom of the package because of the use of a lead frame, and thus, it is possible to provide many channels for signal connection.

What is claimed is:

1. A method of fabricating a printed circuit board having a chip package mounted thereon, comprising the steps of: forming a first etching resistor to form an electric contact portion on an upper side of a first circuit layer on one side of a substrate; applying a first photosensitive substance on the first circuit layer of the substrate to form a first circuit pattern on the first circuit layer, and removing the first photosensitive substance; laminating an insulating layer and a second circuit layer on the substrate, and forming a hole through a portion of the insulating layer wherein the chip package is to be mounted; applying a second photosensitive substance to form a second circuit pattern on the second circuit layer and forming the electric contact portion on the exposed first circuit layer of the substrate; and mounting the chip package wherein the chip package is connected to the electric contact portion.

2. The method as set forth in claim 1, wherein the step of applying a second photosensitive substance comprises the steps of:

applying the second photosensitive substance on an upper side of an outermost circuit layer; forming a third circuit pattern, corresponding to the second circuit pattern of the outermost circuit layer, on the second photosensitive substance, and removing a portion of the second photosensitive substance, which has a position corresponding to the hole; forming the second circuit pattern on the outermost circuit layer on which the second photosensitive substance is laminated, and etching an exposed portion of an internal layer-8 to form the electric contact portion; and removing the second etching resistor.

3. The method as set forth in claim 1, wherein the step of applying a second photosensitive substance comprises the steps of:

applying the second photosensitive substance on an upper side of an outermost circuit layer; forming a third circuit pattern, corresponding to the second circuit pattern of the outermost circuit layer, on the second photosensitive substance; forming a second etching resistor on the third circuit pattern formed on the second photosensitive substance, and removing the second photosensitive substance; and etching a portion of the outermost circuit layer, on which the second etching resistor is laminated, and an exposed portion of an internal layer to form the second circuit pattern of the outermost circuit layer and the electric contact portion of the internal layer.

4. The method as set forth in claim 1, further comprising the step of connecting a side wall of the chip package through a lead frame to the second circuit layer after the step of mounting the chip package.

5. The method as set forth in claim 1, further comprising the steps of:

applying a solder resistor on an outermost circuit layerand an exposed portion of an internal layer, and etching the electric contact portion to remove it; and forming a conductive material on an area which has a position corresponding to the removed electric contact portion, after the step of applying a second photosensitive substance.

* * * * *